(12) United States Patent
Fukuoka

(10) Patent No.: US 6,434,193 B1
(45) Date of Patent: *Aug. 13, 2002

(54) APPARATUS AND METHOD FOR WAVEFORM EQUALIZATION COEFFICIENT GENERATION

(75) Inventor: Toshihiko Fukuoka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/520,339

(22) Filed: Mar. 7, 2000

Related U.S. Application Data

(63) Continuation of application No. 08/833,192, filed on Apr. 14, 1997, now Pat. No. 6,052,413.

(30) Foreign Application Priority Data

Dec. 12, 1996 (JP) .............................. 8-332479
Apr. 16, 1998 (JP) .............................. 8-093914

(51) Int. Cl.[7] .............................................. H03K 5/159
(52) U.S. Cl. ........................ 375/235; 375/229; 371/41
(58) Field of Search ................................. 375/229, 230, 375/231, 232, 233, 234, 316, 324, 346, 350, 235; 371/41; 364/724.2

(56) References Cited

U.S. PATENT DOCUMENTS

| | | | |
|---|---|---|---|
| 3,787,762 A | | 1/1974 | Sato .............................. 323/42 |
| 4,330,861 A | * | 5/1982 | Impallomeni et al. ......... 375/15 |
| 5,512,959 A | | 4/1996 | D'Alto et al. .............. 348/614 |
| 5,648,988 A | | 7/1997 | Iwamatsu et al. ........... 375/232 |
| 5,710,792 A | | 1/1998 | Greenberg .................. 375/232 |
| 5,805,481 A | | 9/1998 | Raghunath .............. 364/724.19 |
| 5,886,748 A | * | 3/1999 | Lee .............................. 348/614 |
| 5,912,828 A | * | 6/1999 | Mondal et al. .......... 364/724.2 |

FOREIGN PATENT DOCUMENTS

JP 07193467 A 7/1995

OTHER PUBLICATIONS

Notice of Reasons for Rejection issued from the Japanese Patent Office Sep. 5, 2000 with English translation.

* cited by examiner

*Primary Examiner*—Chi Pham
*Assistant Examiner*—Dung X Nguyen
(74) *Attorney, Agent, or Firm*—McDermott, Will & Emery

(57) ABSTRACT

A waveform equalization coefficient generator for generating equalization coefficients for taps of digital filters for equalizing signal waveforms is disclosed which is smaller in circuit size and consumes less electric power in comparison with conventional waveform equalization coefficient generators. In a data selection means in a complex arithmetic unit, a first data selection unit selects between real part data and imaginary part data of an equalization coefficient, a second data selection unit selects between real part data and imaginary part data of a received signal, and a third data selection unit selects between EI (error data in the I-axis direction) and EQ (error data in the Q-axis direction). A sum-of-products means is provided which has one multiplier and one adder. The multiplier carries out an operation of multiplying together the output of the data selection means (the real part data or the imaginary part data, whichever is selected) and the output of the data selection means (the Q-axis direction error data or the I-axis direction error data, whichever is selected). The adder carries out an operation of summing together data which are obtained from results of the multiplying operation. Accordingly, either the real part data or the imaginary part data of the equalization coefficient output from the data selection means is updated.

1 Claim, 17 Drawing Sheets

APPARATUS AND METHOD FOR WAVEFORM EQUALIZATION COEFFICIENT GENERATION

This is a divisional of application Ser. No. 08/833,192, filed Apr. 14, 1997 now U.S. Pat. No. 6,052,413.

BACKGROUND OF THE INVENTION

This invention generally relates to apparatus and methods for waveform equalization coefficient generation for use in multivalued digital microwave communication.

In recent years, there has been a tendency towards the multivaluing of modulation/demodulation of the digital microwave communication type for the efficient use of frequency. In addition to modulation techniques such as QPSK and 16QAM, the use of 64QAM and 256QAM has just started.

As the multivaluing of modulation/demodulation advances, effects due to signal distortion or the like occurring in communication paths become relatively serious. Accordingly, technology, having the ability to guarantee that correct signals are received at the receiving side, plays an important part, and automatic adaptive equalizers to achieve transmission path equalization on the receiving side have been proposed.

Transmission path equalization is first described below.

FIG. 16 shows a transmission path and an equalization model thereof. As can be seen from FIG. 16, signals from the transmitter, which vary according to the characteristics of a transmission path, are received together with noise. On the receiving side, an equalizer, serially arranged before the receiver, equalizes a received signal $X_0$ to a desirable signal $Z_0$ for the receiver. When noise is negligible, it is sufficient to employ an equalizer opposite in characteristic to the transmission factor of the transmission path. On the other hand, when noise is great to a certain extent, it is necessary to perform design of an equalizer in consideration of noise. A practically-used equalizer is formed by a digital filter, which is called a digital equalizer.

FIG. 17 is a block diagram of a digital filter. In FIG. 17, $X_0$ is an input received signal applied from through a transmission path. $X_1$ to $X_m$ are received signals having a delay, produced by each delay element, with respect to $X_0$. $C_0$ to $C_m$ are equalization coefficients. $X_0$ is multiplied by $C_0$ by multiplier. Likewise, $X_1$–$X_m$ are multiplied by $C_1$–$C_m$, respectively. The multiplying results are summed together by adder and the sum is provided as an equalization signal, $Z_0$.

A mechanism of multiplying together a delay signal and an equalization coefficient, employed in a digital filter, is known in the art as a tap. By summing together products produced by respective taps, $Z_0$ is obtained. The equalization coefficients $C_0$–$C_m$ best suited for signal restoration are then calculated by a waveform equalization coefficient generator.

An algorithm of generating equalization coefficients is now described below.

As previously described, signals from a transmitter, which vary according to the transmission path characteristic, arrive at a receiver with noise. If the characteristic of a transmission path is constant, then it is sufficient to calculate the opposite transmission path characteristic and use a fixed equalization coefficient that implements the calculated opposite transmission path characteristic. However, in a system in which the effects of noise and characteristics change with time, it is necessary to carry out sequential equalization coefficient updating according to the state of received signals. An automatic adaptive type algorithm is used in equalization coefficient updating. Practically, based on an equalization coefficient in the preceding state, the subsequent equalization coefficient is computed. In this case, a specific evaluation index is set, and equalization coefficient updating processing is carried out in order that the set value is minimized. A typical algorithm of such a type is the LMS (least means square) algorithm.

In the LMS algorithm, a means square error is used as an evaluation index for equalization coefficient. More specifically, the equalization coefficient is given by $$C_{n+1,m} = C_{n,m} - \alpha \times X_m \times e_0 \qquad \text{(Expression 1)}$$

where n is the number of times the equalization coefficient is updated, m is an equalization coefficient's tap number, $e_0$ is $Z_0$–$x_0$ ($x_0$ is a pre-transmission signal), and $\alpha$ is the step size.

If the signal $X_m$ and the error data $e_0$ are complex-expressed by $$X_m = X_{m(r)} - jX_{m(i)}$$

$$e_0 = e_{0(r)} + je_{0(i)}$$

where (r) represents the real part data and (i) represents the imaginary part data, then the following is obtained.

$$X_m \times e_0 = (X_{m(r)} \times e_{0(r)} + X_{m(i)} \times e_{0(i)}) + j(X_{m(r)} \times e_{0(i)} - X_{m(i)} \times e_{0(r)})$$

Accordingly, Expression (1) becomes the following.

$$C_{n+1,m(r)} = C_{n,m(r)} - \alpha \times (X_{m(r)} \times e_{0(r)} + X_{m(i)} \times e_{0(i)}) \qquad \text{(Expression 2)}$$

$$C_{n+1,m(i)} = C_{n,m(i)} - \alpha \times (X_{m(r)} \times e_{0(i)} - X_{m(i)} \times e_{0(r)}) \qquad \text{(Expression 3)}$$

However, in actual transmission systems, the pre-transmission signal, $x_0$, is unknown at the receiving side and therefore cannot be used to calculate the error data $e_0$. For this reason, it is designed such that estimation for pre-transmission signals is performed on the receiving side and waveform equalization processing is carried out using the estimated value as a reference signal. This is called a blind algorithm.

Practically, it very hard to understand the fact that updating by a blind algorithm, when it is repeated several thousand times under specific conditions, results in equalization coefficient convergence and signal waveform equalization is accomplished. A commonly-used waveform equalization coefficient generator performs arithmetic operations as shown in Expressions (2) and (3) for equalization coefficient updating.

However, there are the following problems with conventional waveform equalization coefficient generators.

When performing equalization coefficient updating according to Expressions (2) and (3), it is necessary to prepare error data for respective signal data. This enormously increases the storage capacity of memory necessary for storing the error data and thereby increases the size of circuitry.

In addition to the above-described problem, there is another problem that many arithmetic units are required for performing equalization coefficient updating. For instance, six multipliers, and four adders or subtracters are necessary. A conventional waveform equalization coefficient generator becomes large in circuit size and consumes more electric power.

SUMMARY OF THE INVENTION

Bearing in mind the above-described problems with the prior art techniques, the present invention was made. It is therefore a general object of this invention to provide an improved waveform equalization coefficient generator which is smaller in circuit size and which consumes less electric power in comparison with conventional ones.

The present invention provides the following waveform equalization coefficient generators.

In a digital equalizer for waveform equalizing a signal modulated by a multivalued QAM (quadrature amplitude modulation) technique and transmitted and a pre-transmission signal, the present invention provides a waveform equalization coefficient generator for generating equalization coefficients for respective taps of digital filters which perform signal waveform equalization wherein said waveform equalization coefficient generator carries out updating of an equalization coefficient by means of separate updating of real part data and imaginary part data of said equalization coefficient and wherein a common arithmetic unit is used to perform arithmetic operations for updating said real part data and said imaginary part data by adaptively selecting data required in said arithmetic operations.

Such arrangement achieves a considerable simplification in apparatus configuration and thereby reduces not only the size of circuit but also the consumption of electric power.

The above-described waveform equalization coefficient generator comprises:

(a) an error data generation unit for generating error data necessary to update an equalization coefficient to a received signal; and (b) a complex arithmetic unit for performing, based on said received signal and error data output from said error data generation unit, updating of said equalization coefficient by means of separate updating of real part data and imaginary part data of said equalization coefficient;

wherein:
  said error data generation unit carries out generation of said error data by means of separate generation of I-axis direction error data and Q-axis direction error data; and
  said complex arithmetic unit adaptively selects between real part data and imaginary part data of said received signal and adaptively selects between said I-axis direction error data and said Q-axis direction data, to perform arithmetic operations for updating said real part data and imaginary part data of said equalization coefficient by means of a common arithmetic unit.

The above-described complex arithmetic unit includes:

(a) data selection means for selecting between real part data and imaginary part data of a pre-updating equalization coefficient, selecting between real part data and imaginary part data of a received signal, and selecting between I-axis direction error data and Q-axis direction error data output from said error data generation unit, according to a data selection control signal applied, and for providing the selected data; and (b) sum-of-products means for multiplying together one of said real part data and said imaginary part data of said received signal that is output from said data selection means and one of said I-axis direction error data and said Q-axis direction error data that is output from said data selection means and for summing together data obtained from results of said multiplying operation, to update either said real part data or said imaginary part data of said pre-updating equalization coefficient.

In a digital equalizer for waveform equalizing a signal modulated by a multivalued QAM (quadrature amplitude modulation) technique and transmitted and a pre-transmission signal, the present invention provides a waveform equalization coefficient generator for generating equalization coefficients for respective taps of digital filters which perform signal waveform equalization, said waveform equalization coefficient generator comprising:
  (a) an error data generation unit for generating, to a received signal, error data necessary to update an equalization coefficient with a STOP&GO algorithm that is an LMS (Least Means Square) algorithm using a STOP&GO function; and
  (b) a complex arithmetic unit for performing, based on said received signal and said error data output from said error data generation unit, equalization coefficient updating;

said error data generation unit including:
  (c) a coordinate decision unit for finding coordinate data indicative of a location of a multivalued QAM phase diagram occupied by a received signal and for providing, based on said coordinate data found, either a stop data signal indicative of the interruption of the output of error data or address data corresponding to said coordinate data;
  (d) storage means for storing error data corresponding to each coordinate data and for providing error data stored at an address identified by said address data output from said coordinate decision unit; and
  (e) a data selection unit for either providing a predetermined value in the presence of said stop data signal from said coordinate decision unit or providing said error data output from said storage means in the absence of said stop data signal.

It is preferred that arithmetic operations for equalization coefficient updating are brought to a halt in said complex arithmetic unit when said coordinate decision unit provides said stop data signal.

In a digital equalizer for waveform equalizing a signal modulated by a multivalued QAM (quadrature amplitude modulation) technique and transmitted and a pre-transmission signal, the present invention provides a waveform equalization coefficient generator for generating equalization coefficients for respective taps of digital filters which perform signal waveform equalization, said waveform equalization coefficient generator comprising:
  (a) an error data generation unit for generating, to a received signal, error data necessary to update an equalization coefficient with a STOP&GO algorithm that is an LMS (Least Means Square) algorithm using a STOP&GO function; and
  (b) a complex arithmetic unit for performing, based on said received signal and said error data output from said error data generation unit, equalization coefficient updating;

said error data generation unit including:
  (c) a coordinate data selection unit for determining whether coordinate data indicative of a location of a multivalued QAM phase diagram occupied by said received signal is positive or negative, wherein, when said coordinate data is determined to be positive, said coordinate data is provided intact from said coordinate data selection unit as coordinate data of judgement while on the other hand, when said coordinate data is determined to be negative, said coordinate data is bit-inverted and then provided from said coordinate data selection unit as coordinate data of judgement, and wherein said coordinate data selection unit provides an inversion indication signal indicative of whether said judgement coordinate data has undergone bit inversion processing;

(d) an error evaluation data storage unit for storing a plurality of error evaluation data corresponding to positive coordinate data, for selecting, from said plurality of error evaluation data, error evaluation data corresponding to said judgment coordinate data output from said coordinate data selection unit, and for providing the selected error evaluation data; and (e) an error data selection unit;

when said coordinate data selection unit provides said inversion indication signal indicative of the absence of bit inversion, said error data selection unit then providing, in intact form, said error evaluation data output from said error evaluation data storage unit as error data;

when said coordinate data selection unit provides said inversion indication signal indicative of the presence of bit inversion, said error data selection unit then bit-inverting said error evaluation data and providing said bit-inverted error evaluation data as error data.

As a result of such arrangement, the error data generation unit generates, based on error evaluation data corresponding to positive coordinate data previously stored in the error evaluation data storage unit, error data to a received signal. In other words, data required to be pre-stored for error data generation are only error evaluation data corresponding to positive coordinate data. A considerable reduction of the capacity of storage required by the error data generation unit can be realized, which makes it possible to implement a waveform equalization coefficient generator with downsized circuitry.

In a digital equalizer for waveform equalizing a signal modulated by a multivalued QAM (quadrature amplitude modulation) technique and transmitted and a pre-transmission signal, the present invention provides a waveform equalization coefficient generator for generating equalization coefficients for respective taps of digital filters which perform signal waveform equalization, said waveform equalization coefficient generator comprising:

(a) an error data generation unit for generating, to a received signal, error data necessary to update an equalization coefficient with a STOP&GO algorithm that is an LMS (Least Means Square) algorithm using a STOP&GO function; and (b) a complex arithmetic unit for performing, based on said received signal and said error data output from said error data generation unit, equalization coefficient updating;

said error data generation unit including:

(c) a reference data storage unit for storing:

Sato error reference data indicative of a coordinate for a Sato error reference point in a multivalued QAM phase diagram;

coordinate decision reference data indicative of a slice level value in said multivalued QAM phase diagram;

error decision reference data indicative of a coordinate for a signal reference point in said multivalued QAM phase diagram;

(d) an LMS error generation unit for determining, based on coordinate data indicative of a location of said multivalued QAM phase diagram occupied by said received signal as well as on coordinate decision reference data output from said reference data storage unit, which of regions in said multivalued QAM phase diagram defined by respective slice levels said received signal belongs to, and for generating, based on error decision reference data output from said reference data storage unit indicative of a coordinate for a signal reference point in said determined region, LMS error data to said received signal;

(e) a Sato error generation unit for generating, based on Sato error reference data as well as on coordinate decision reference data output from said reference data storage unit, Sato error data to said received signal; and (f) an error data selection unit for receiving said LMS error data generated by said LMS error generation unit and a sign bit of said Sato error data generated by said Sato error generation unit, when a sign bit of said LMS error data and said sign bit of said Sato error data agree, said error data selection unit selecting said LMS error data and providing said LMS error data as error data;

when said sign bits disagree, said error data selection unit selecting data having a predetermined value and providing said data as error data.

As a result of such arrangement, the error data generation unit generates, based on the Sato error reference data, coordinate decision reference data and error decision reference data previously stored in the reference data storage unit, error data to a received signal. In other words, data required to be pre-stored for error data generation are only reference data of respective types. A considerable reduction of the capacity of storage required by the error data generation unit can be realized, which makes it possible to implement a waveform equalization coefficient generator with downsized circuitry.

DETAILED DESCRIPTION OF THE INVENTION

Waveform equalization coefficient generators made in accordance with embodiments of the present invention are now described by making reference to the accompanying drawings.

Figure 1:
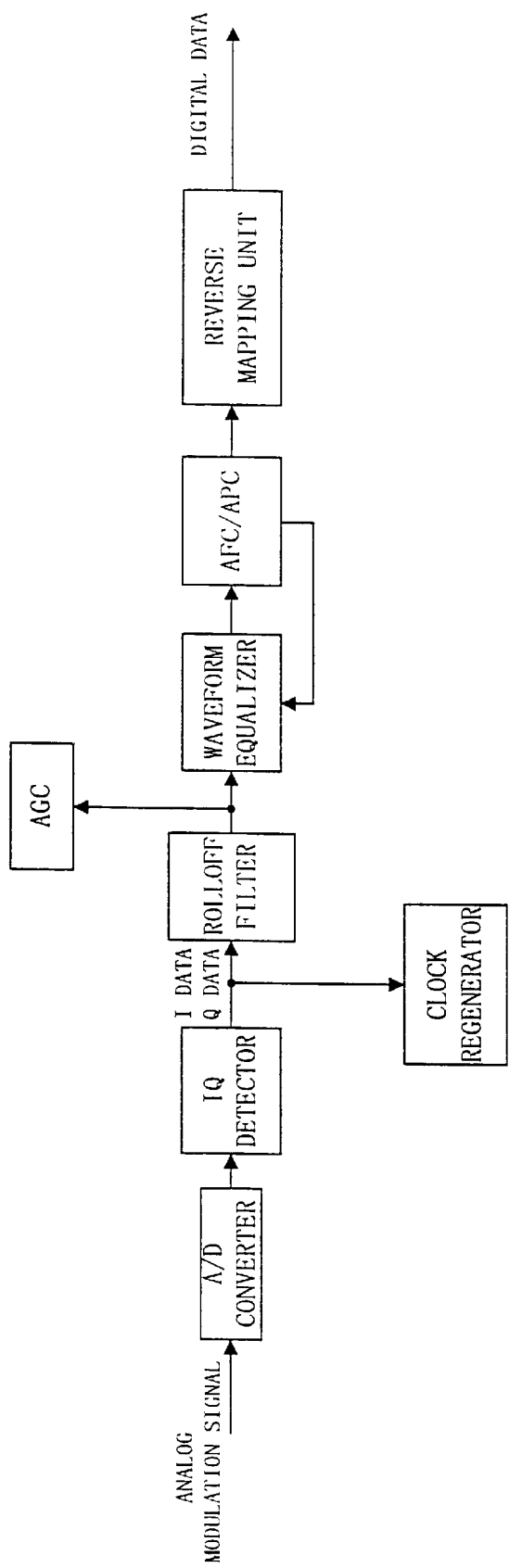
FIG. 1 depicts in block form an LSI for signal demodulation including a waveform equalizer.

FIG. 1 is a block diagram of an entire large-scale integrated circuit for use in signal modulation employing a waveform equalizer (a digital equalizer). An input analog modulation signal is translated by an A/D converter into a digital modulation signal. The digital modulation signal is then divided into an In-phase signal (I data) and a quadrature signal (Q data) in an I/Q detector. Clocks are extracted from the I and Q data in a clock regeneration unit, which synchronize with pre-modulation original signals.

After both the I data and the Q data pass through a rolloff filter for waveform shaping, they are fed to a waveform equalizer (a digital equalizer) for waveform equalization. AFC (auto frequency control) processing and APC (auto phase control) processing are carried out to the signals temporarily equalized by the waveform equalizer, to remove frequency offset and phase offset. The signals, AFCed and APCed, are brought back again to the waveform equalizer. A series of operations comprising waveform equalization processing and AFC/APC processing is repeatedly performed until equalization convergence is made. Meanwhile, AGC (auto gain control) processing is carried out based on the signal which is waveform-shaped in the rolloff filter.

The converged I and Q data are converted by a reverse mapping unit into usual digital data.

Figure 2:
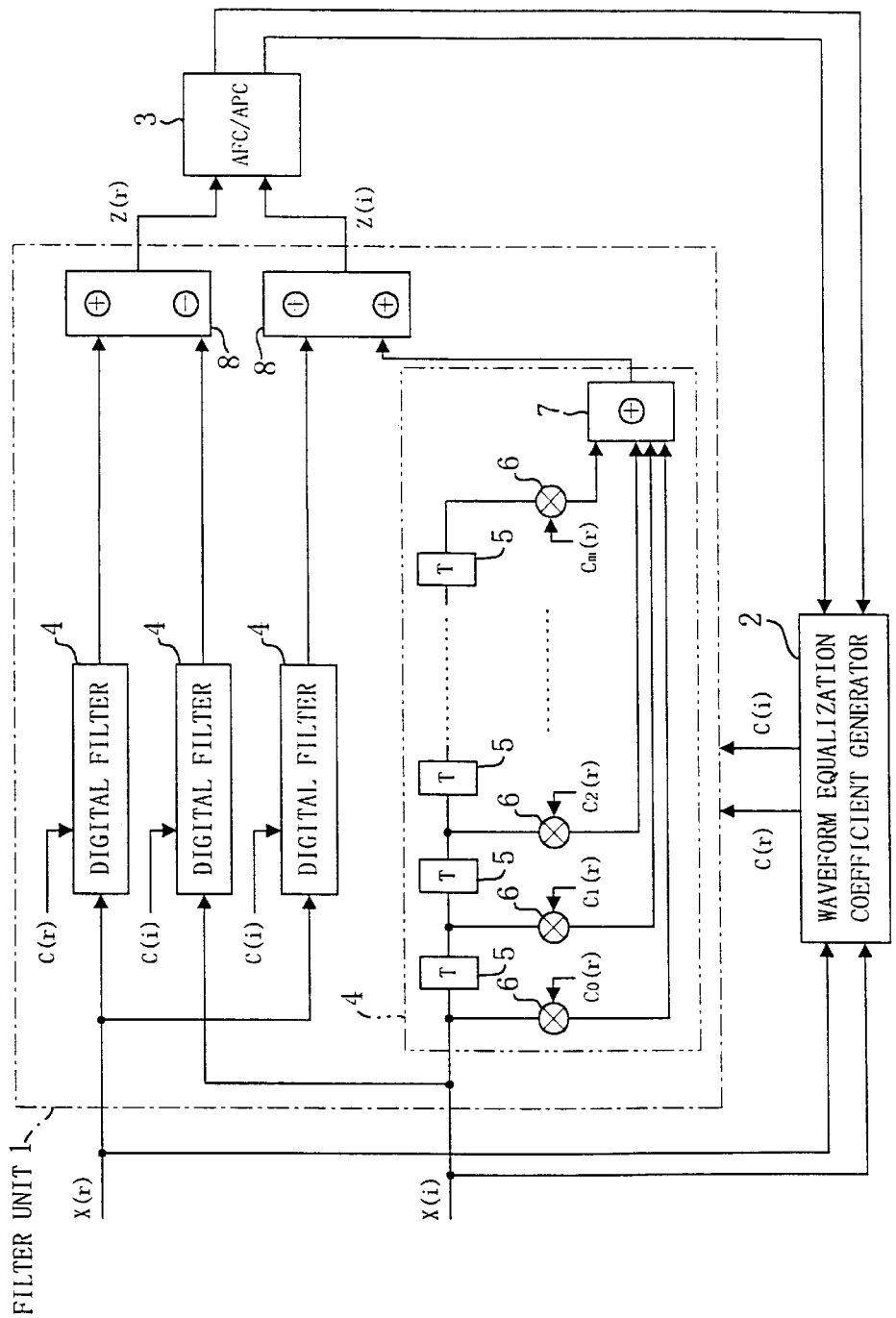
FIG. 2 is a positional diagram of a waveform equalization coefficient generator in accordance with an embodiment of the present invention and shows in block form a digital equalizer.

FIG. 2 is a block diagram roughly showing a digital equalizer. The digital equalizer of FIG. 2 is composed of a filter unit 1 and a waveform equalization coefficient generator 2. Waveform equalizer coefficient generator 2 calculates equalization coefficients at respective taps of digital filters 4 forming filter unit 1. Filter unit 1 uses these calculated equalization coefficients, to operate each digital filter 4 for the conversion of a received signal X into an equalization signal Z. Each digital filter 4 is made up of a delay element 5, a tap 6, and an adder 7. In general, the equalization signal Z is given by $$Z = \sum_{k=0}^{m} C_k \times X_k$$

where k is a variable indicative of a tap number. When the equalization signal Z is given in a complex notation, if $X=X_{(r)}+jX_{(i)}$ and $C=C_{(r)}+jC_{(i)}$, then:

$$Z_{(r)} = \sum_{k=0}^{m} (C_{k(r)} \times X_{k(r)} - C_{k(i)} \times X_{k(i)})$$

$$Z_{(i)} = \sum_{k=0}^{m} (C_{k(r)} \times X_{k(i)} + C_{k(i)} \times X_{k(r)})$$

Accordingly, filter unit 1 requires four digital filters 4. The output data from digital filters 4 are subjected to addition/subtraction in adder/subtracter 8 and are provided as an equalization signal $Z_{(r)}$ and as an equalization signal $Z_{(i)}$. These equalization signals $Z_{(r)}$ and $Z_{(i)}$ are applied to AFC/APC unit 3.

A technique known as STOP&GO algorithm is used to find equalization coefficients. This STOP&GO algorithm is a technique for determining whether to carry out an equalization coefficient updating according to the vectorial direction of LMS error and Sato error. More specifically, STOP&GO algorithm is a blind algorithm that performs waveform equalization without using any reference signals.

The LMS error is defined by $$LMSER=Z_0-D$$

where LMSER is the LMS error and D is the reference signal.

The Sato error is defined as follows. If a reference value for a Sato error is B, then B is defined by:

$$B=E(|A_n|^2)/E(|A^n|)$$

where $A_n$ is the reference signal's vector and $E(\ )$ is the mean. If the Sato error is SATER, then $$SATER=Z_0-B$$

Figure 3:
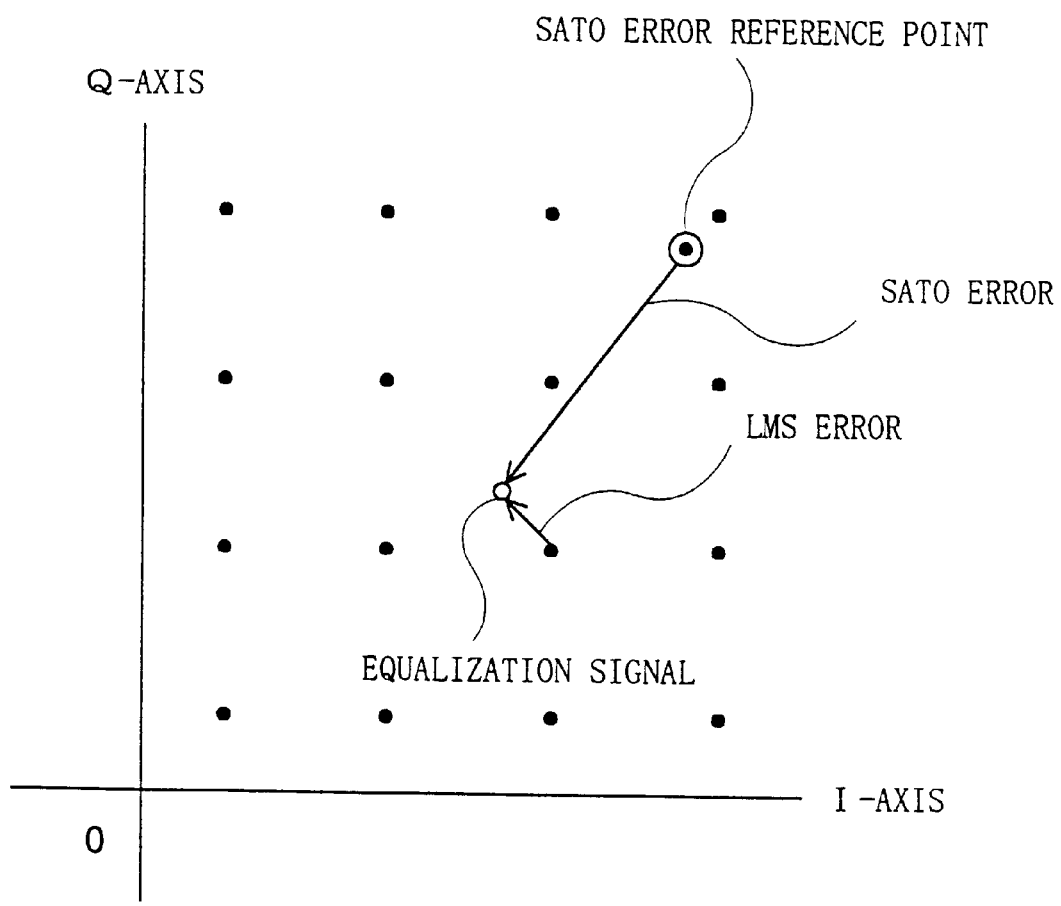
FIG. 3 is a diagram for describing LMS and Sato errors in QAM.

FIG. 3 is the first quadrant of a phase diagram of 64QAM showing an LMS error-Sato error relationship. In FIG. 3, the mark ● indicates a signal point location and the mark ⊙ indicates a reference point for a Sato error. FIG. 3 shows vectors of an LMS error and a Sato error when the equalization sinal $Z_0$ is located at a location indicated by the mark ○. The number of Sato error reference points are four altogether, in other words each quadrant has one Sato error reference point, and an LMS error reference point is the signal point. For the case of 64QAM, the number of LMS error reference points is 64.

The following are expressions for equalization coefficient updating when a STOP&GO algorithm is used.

$$C_{n+1,m(r)}=C_{n,m(r)}-\alpha \times (X_{m(r)} \times e_{0(r)} \times f_r + X_{m(i)} \times e_{0(i)} \times f_i) \quad \text{(Expression 4)}$$

$$C_{n+1,m(i)}=C_{n,m(i)}-\alpha \times (X_{m(r)} \times e_{0(i)} \times f_i - X_{m(i)} \times e_{0(r)} \times f_r) \quad \text{(Expression 5)}$$

$f_r$ and $f_i$ are flags which are calculated independently of each other for a real axis and an imaginary axis, respectively. These flags are defined by the following conditions.

$f_r$=1;sgn (LMSER's I component)=sgn (SATER's I component)
  0;sgn (LMSER's I component)≠sgn (SATER's I component)
$f_i$=1;sgn (LMSER's Q component)=sgn (SATER's Q component)
  0;sgn (LMSER's Q component)≠sgn (SATER's Q component)

If $e_{0(r)}$ times $f_r$ is EI and $e_{0(i)}$ times $f_i$ is EQ, then Expressions (4) and (5) become the following Expressions (6) and (7), respectively.

$$C_{n+1,m(r)}=C_{n,m(r)}-\alpha \times (X_{m(r)} \times EI + X_{m(i)} \times EQ) \quad \text{(Expression 6)}$$

$$C_{n+1,m(i)}=C_{n,m(i)}-\alpha \times (X_{m(r)} \times EQ - X_{m(i)} \times EI) \quad \text{(Expression 7)}$$

EI and EQ are error data.

The waveform equalization coefficient generators of the present invention carry out updating of equalization coefficients according to Expressions (6) and (7).

First Embodiment

Figure 4:
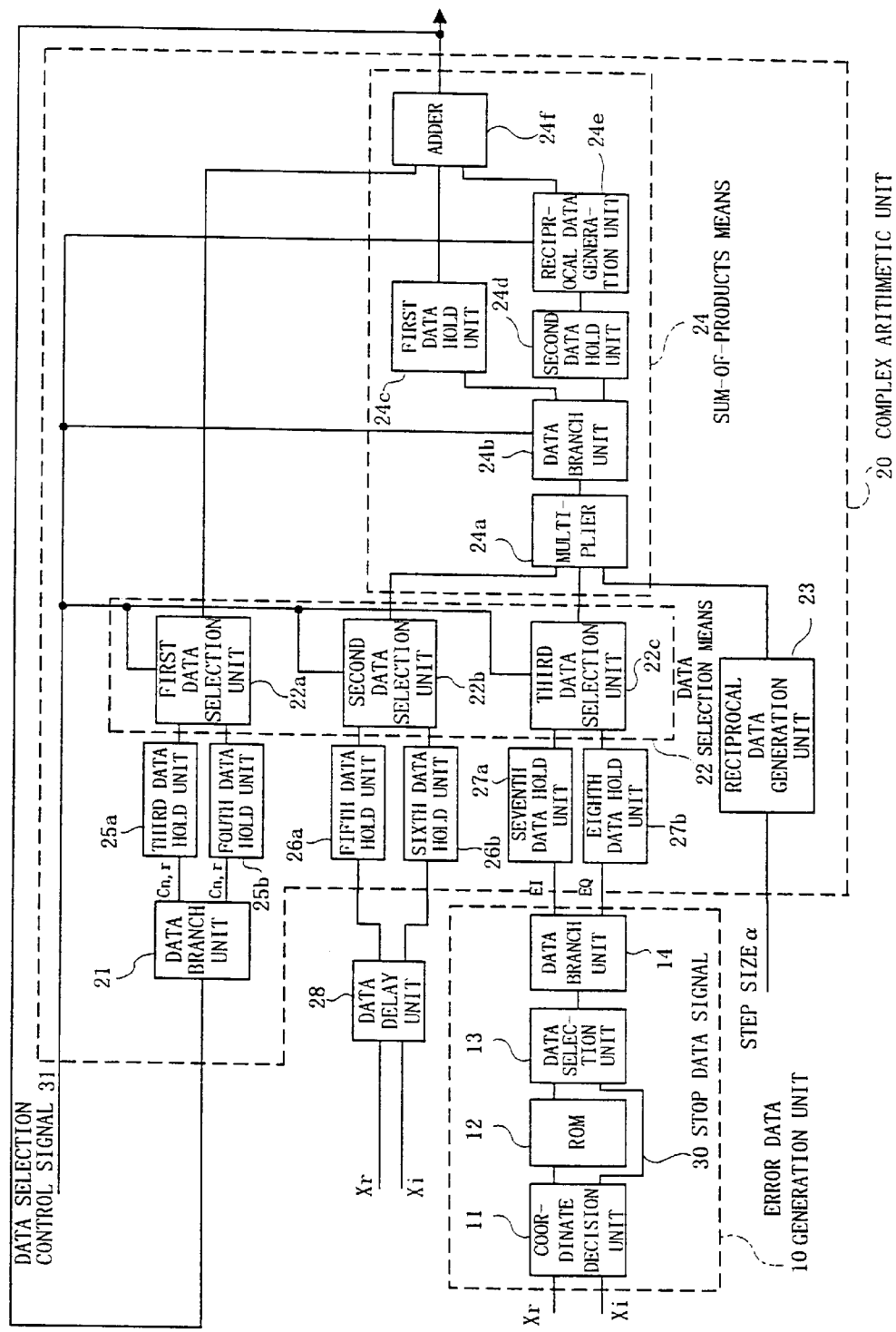
FIG. 4 is a block diagram of a waveform equalization coefficient generator in accordance with a first embodiment of the present invention.

FIG. 4 is a block diagram of a waveform equalization coefficient generator in accordance with a first preferred embodiment of the present invention. 10 is an error data generation unit. Error data generation unit 10 generates error data EI and error data EQ which are used in equalization coefficient updating. 20 is a complex arithmetic unit. Complex arithmetic unit 20 uses the error data EI and the error data EQ output from error data generation unit 10, to carry out complex arithmetic operations to update equalization coefficients.

The error data generation 10 comprises a coordinate decision unit 11, a ROM 12 as a storage means, a data selection unit 13, and a data branch unit 14.

Complex arithmetic unit 20 comprises a data branch unit 21, a data selection means 22, a reciprocal data generation unit 23, a sum-of-products means 24, and a third to an eighth data hold unit 25a, 25b, 26a, 26b, 27a, 27b. Data selection means 22 is made up of a first data selection unit 22a, a second data selection unit 22b, and a third data selection unit 22c. Sum-of-products means 24 is made up of a multiplier 24a, a data branch unit 24b, a first data hold unit 24c, a second data hold unit 24d, a reciprocal data generation unit 24e, and an adder 24f. The waveform equalization coefficient generator shown in FIG. 4 further includes a data delay unit 28.

Note here that the equalization coefficient's tap number, m, is fixed. Expressions (6) and (7) are as follows.

$$C_{n+1,r}=C_{n,r}-\alpha \times (X_r \times EI + X_i \times EQ) \quad \text{(Expression 8)}$$

$$C_{n+1,i}=C_{n,i}-\alpha \times (X_r \times EQ - X_i \times EI) \quad \text{(Expression 9)}$$

The operation of the waveform equalization coefficient generator shown in FIG. 4 at the time of performing an equalization coefficient updating according to Expressions (8) and (9), is now explained below.

First of all, the operation of error data generation unit 10 is described.

Based on the mode selection control signal (not shown) applied from the outside, either 16QAM, 64QAM, or 256QAM is chosen as a multivalued QAM. Coordinate decision unit 11 sets signal point locations and slice levels on a phase diagram for the selected multivalued QAM and determines which coordinate on the phase diagram a received signal is located at.

Figure 5:
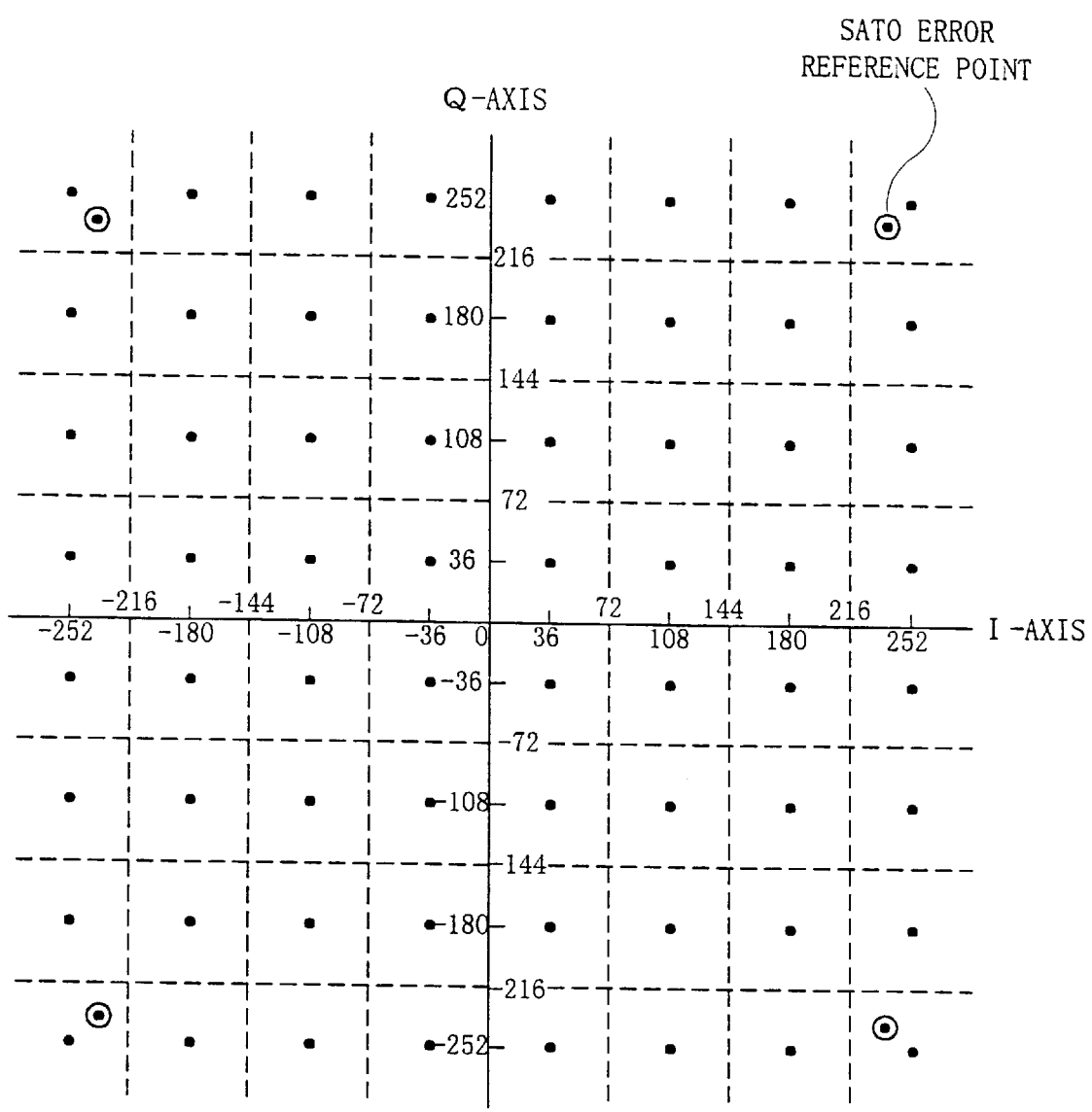
FIG. 5 is a phase diagram showing signal point locations, slice levels and reference points for Sato errors in 64QAM.

FIG. 5 is a phase diagram showing signal point locations and slice levels which are set when 64QAM is selected as a multivalued QAM form. The mark ● indicates a signal point location. A broken line indicates a slice level. The mark ⊙ indicates a Sato error's reference point. As shown in FIG. 5, coordinates of the signal point locations are −252, −180, −108, −36, 36, 108, 180, and 252, and coordinates of the slice levels are −216, −144, −72, 0, 72, 144, and 216.

Additionally, coordinates of the Sato error's reference points are (247,247), (−247, 247), (−247, −247) and (247, −247).

Figure 6:
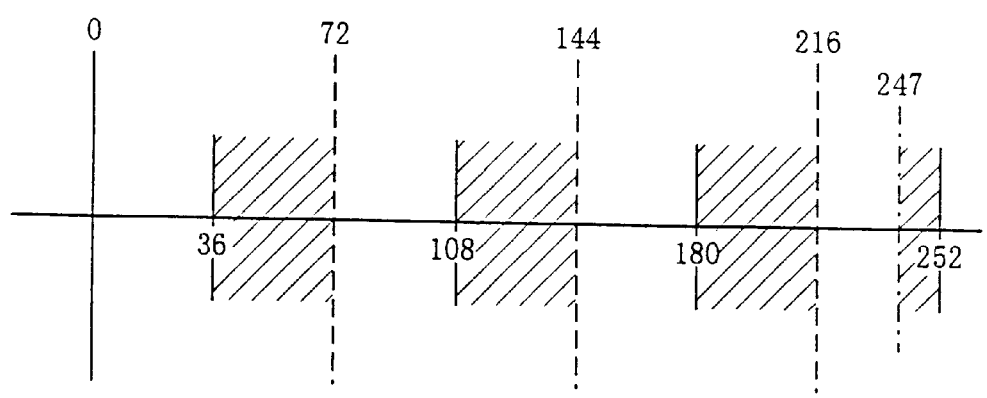
FIG. 6 is a diagram showing portions of I-axis data in the positive direction of the FIG. 4 phase diagram and further showing a range within which the flag $f_r$ becomes zero.

Here, only I-axis data are considered for the sake of making the description simple and the resulting signal point locations and slice levels are shown in FIG. 6. The value of the flag $f_r$ is shown below.

from 0 to 36 $f_r=1$
from 36 to 72 $f_r=0$
from 72 to 108 $f_r=1$
from 108 to 144 $f_r=0$
from 144 to 180 $f_r=1$
from 180 to 216 $f_r=0$
from 216 to 247 $f_r=1$
from 247 to 252 $f_r=0$
from 252 onward $f_r=1$ Hatched regions of FIG. 6, within which $f_r 0$, are error free regions. For example, when the input signal's real part data (I-axis data), $X_r$, is [110], then $f_r=0$ since it is within the range of 108 to 144. When the I-axis data $X_r$ is [151], then $f_r=1$ since it is within the range of 144 to 180. When $f_r=0$, the error data EI becomes zero.

Coordinate decision unit 11 determines a value for $f_r$ (the flag) from $X_r$ (the input signal's I-axis data). Coordinate decision unit 11 provides a stop data signal 30 to data selection unit 13 when $f_r=0$, while on the other hand, coordinate decision unit 11 outputs specific address data corresponding to $X_r$ to ROM 12 when $f_r=1$. Corresponding error data to I-axis data in a range within which $f_r=1$, are previously stored in ROM 12. When address data is output from coordinate decision unit 11, ROM 12 provides error data stored at an address identified by the address data.

In the absence of stop data signal 30 from coordinate decision unit 11, the error data output from ROM 12 is provided intact from data selection unit 13. On the other hand, in the presence of stop data signal 30 from coordinate decision unit 11, data selection unit 13 provides a "0" as error data.

Likewise, coordinate decision unit 11 determines a value for $f_r$ from $X_i$ (the input signal's imaginary part data, i.e., the Q-axis data). Coordinate decision unit 11 provides a stop data signal 30 to data selection unit 13 when $f_r=0$, while on the other hand, coordinate decision unit 11 outputs specific address data corresponding to $X_i$ to ROM 12 when $f_r=1$. Corresponding error data to Q-axis data in a range within which $f_r=1$, are previously stored in ROM 12. When address data is output from coordinate decision unit 11, ROM 12 provides error data stored at an address identified by the address data.

In the absence of the stop data signal 30 from coordinate decision unit 11, the error data output from ROM 12 is provided intact from data selection unit 13. On the other hand, in the presence of the stop data signal 30 from coordinate decision unit 11, data selection unit 13 provides a "0" as error data.

Data branch unit 14 provides the error data output from data selection unit 13 as the error data EI or as the error data EQ. In this way, either EI or EQ is provided from error data generation unit 10.

The operation of complex arithmetic unit 20 is now described below.

An equalization coefficient, output from complex arithmetic unit 20, is entered as a pre-updating equalization coefficient (that is, an equalization coefficient that is updated) to data branch unit 21. Data branch unit 21 divides the equalization coefficient into real part data $C_{n,r}$ and imaginary part data $C_{n,i}$ and thereafter provides them, in other words, data branch unit 21 provides the equalization coefficient by the separate output of the real part data $C_{n,r}$ and the imaginary part data $C_{n,i}$. The real part data $C_{n,r}$ is held in third data hold unit 25a while the imaginary part data $C_{n,i}$ is held in fourth data hold unit 25b.

Both the real part data $X_r$ and the imaginary part data $X_i$ of the input signal are delayed by data delay unit 28 and thereafter are fed to complex arithmetic unit 20. Data delay unit 28 is for the adjustment of the input timing of $X_r$ and $X_i$ to the delay time taken for error data generation unit 10 to generate error data. The real part data $X_r$ is held in fifth data hold unit 26a while the imaginary part data $X_i$ is held in sixth data hold unit 26b.

The error data EI output from error data generation unit 10 is held in seventh data hold unit 27a while the error data EQ is held in eighth data hold unit 27b.

Based on the data selection control signal 31, (a) first data selection unit 22a carries out a selection between $C_{n,r}$ (the equalization coefficient's real part data) held in third data hold unit 25a and $C_{n,i}$ (the equalization coefficient's imaginary part data) held in fourth data hold unit 25b and provides $C_{n,r}$ or $C_{n,i}$, whichever is selected, (b) second data selection unit 22b carries out a selection between $X_r$ (the input signal's real part data) held in fifth data hold unit 26a and $X_i$ (the input signal's imaginary part data) held in sixth data hold unit 26b and provides the selected data, and (c) third data selection unit 22c carries out a selection between EI (the error data) held in seventh data hold unit 27a and EQ (the error data) held in eighth data hold unit 27b and provides the selected data. Reciprocal data generation unit 23 generates reciprocal data for the step size $\alpha$ that is applied from the outside.

The output data from first to third data selection units 22a to 22c and the output data from reciprocal data generation unit 23 are fed to sum-of-products means 24.

Multiplier 24a multiplies together the output data from second data selection unit 22b, the output data from third data selection unit 22c, and the output data from reciprocal data generation unit 23, and the result is fed to data branch unit 24b. Data branch unit 24b outputs, based on the data selection control signal 31, the input data, either to first data hold unit 24c or to second data hold unit 24d.

When receiving data from data branch unit 24b, first data hold unit 24c forwards the received data to adder 24f. On the other hand, when receiving data from data branch unit 24b, second data hold unit 24e forwards the received data to reciprocal data generation unit 24e. Based on the data selection control signal 31, reciprocal data generation unit 24e generates reciprocal data for the data received from second data hold unit 24d or provides the as-received data from second data hold unit 24d.

Adder 24f carries out an operation of summing together the output data of first data selection unit 22a, the output data of first data hold unit 24c and the output data of reciprocal data generation unit 24e and provides the sum as a new equalization coefficient.

The operation of equalization coefficient updating performed according to Expressions (8) and (9) is described below.

$X_r$ (the input signal's real part data) is first entered, while EI (the error data) is calculated by error data generation unit 10. A calculation of $(-\alpha) \times X_r \times EI$ is carried out in multiplier 24a and the result is held in first data hold unit 24c.

Thereafter, $X_i$ (the input signal's imaginary part data) is entered, while EQ (the error data) is calculated by error data generation unit 10. A calculation of $(-\alpha) \times X_i \times EQ$ is carried out in multiplier 24a and the result is held in second data hold unit 24d.

Finally, a calculation of $C_{n,r}+(-\alpha) \times X_r \times EI+(-\alpha) \times X_i \times EQ$ is carried out by adder 24f to produce a new equalization coefficient's real part data, $C_{n+1,r}$. By these operations, the updating of the equalization coefficient's real part data is executed according to Expression (8).

$X_r$ (the input signal's real part data) is entered, while EQ (the error data) is calculated by error data generation unit 10. A calculation of $(-\alpha) \times X_r \times EQ$ is carried out in multiplier 24a and the result is held in first data hold unit 24c.

Thereafter, $X_i$ (the input signal's imaginary part data) is entered, while EI (the error data) is calculated by error data generation unit 10. A calculation of $(-\alpha) \times X_i \times EI$ is carried out in multiplier 24a and the result is held in second data hold unit 24d. A calculation of $\alpha \times X_i \times EI$ ($=-(-\alpha) \times X_i \times EI$) is performed in reciprocal data generation unit 24e.

Finally, a calculation of $C_{n,i}+(-\alpha) \times X_r \times EQ+\alpha \times X_i \times EI$ is carried out by adder 24f to produce a new equalization coefficient's imaginary part data, $C_{n+1,i}$. By these operations, the updating of the equalization coefficient's imaginary part data is executed according to Expression (9).

Figure 7:
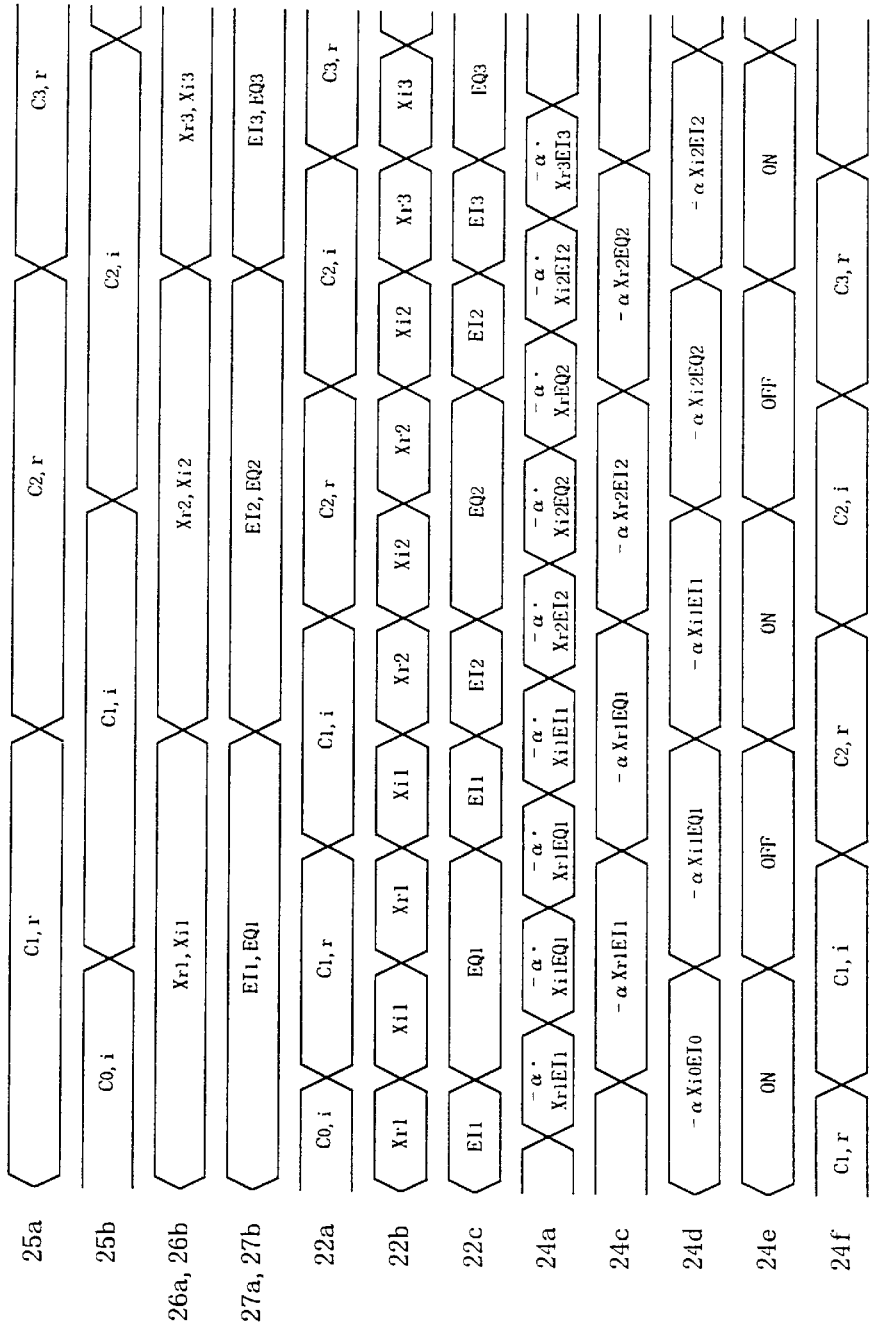
FIG. 7 is a flowchart useful in understanding the operation of the waveform equalization coefficient generator shown in FIG. 4.

FIG. 7 is a timing chart showing the operation of the waveform equalization coefficient generator shown in FIG. 4.

Based on data selection control signal 31, (a) first data selection unit 22a adaptively selects between $C_r$ and $C_i$, (b) second data selection unit 22b adaptively selects between $X_r$ and $X_i$, and (c) third data selection unit 22c adaptively selects between EI and EQ. Reciprocal data generation unit 24e performs a switch between the generation and the non-generation of reciprocal data for the data held in second data hold unit 24d. Such operations enable the alternate output of $C_r$ and $C_i$.

As described above, in accordance with the waveform equalization coefficient generator of the present embodiment, the number of in-generator multipliers and the number of in-generator adders can be reduced considerably by the selective updating of real part data and imaginary part data of a received signal and by adaptively selecting a received signal and error data at the time of updating.

Additionally, there is no need for storing error data with respect to a signal that causes error data to become a predetermined value, therefore achieving a considerable reduction of the storage capacity of ROM in the error data generation unit.

Second Embodiment

A second embodiment of the present invention is now described by the drawings.

Figure 8:
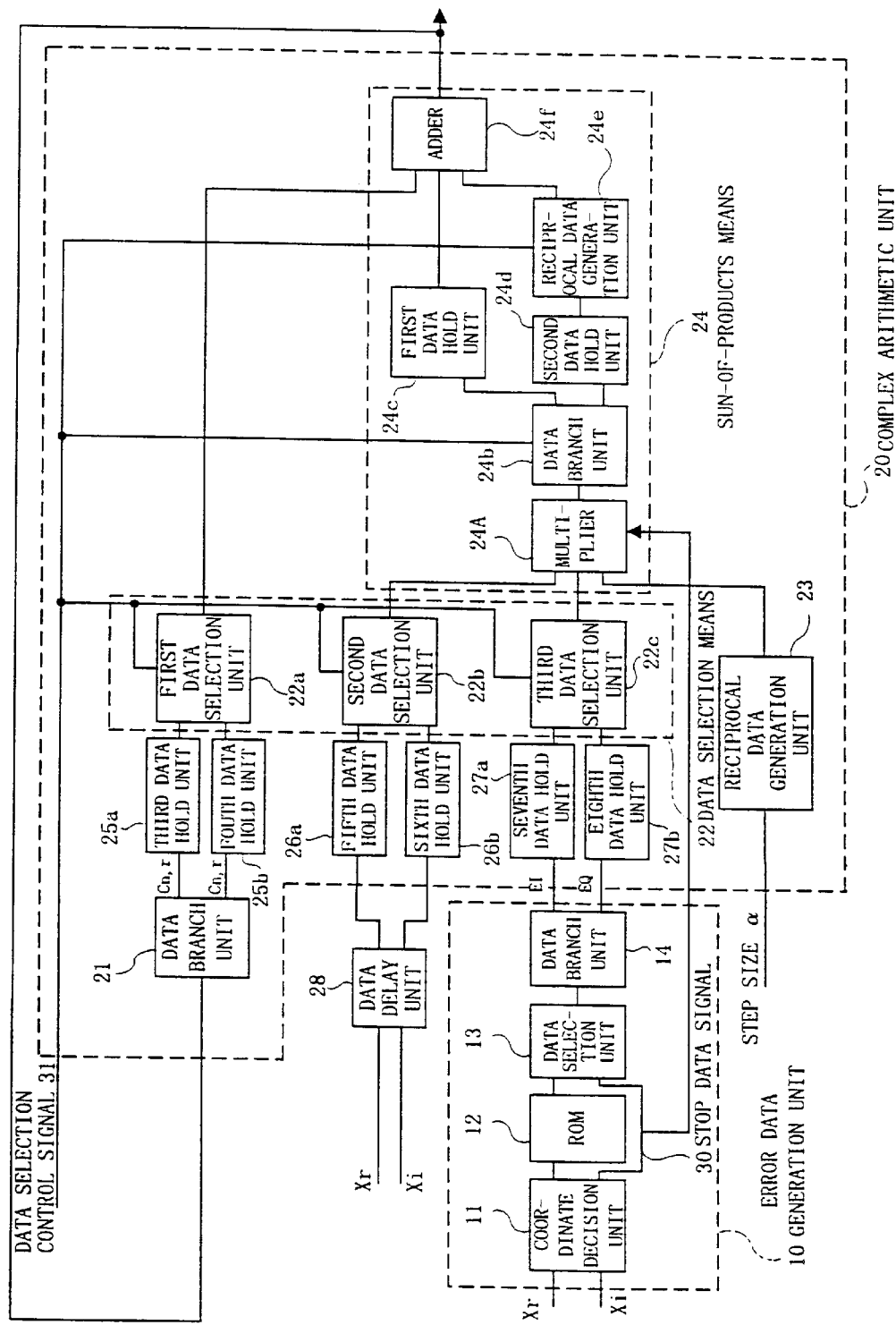
FIG. 8 is a block diagram of a waveform equalization coefficient generator in accordance with a second embodiment of the present invention.

FIG. 8 is a block diagram of a waveform equalization coefficient generator in accordance with the second embodiment. The waveform equalization coefficient generator of FIG. 8 is identical in structure with the waveform equalization coefficient generator shown in FIG. 4, with the exception that stop data signal 30, output from coordinate decision unit 11 in error data generation unit 10, is applied to a multiplier 24A. In FIGS. 4 and 8, like reference numerals have been used to indicate like elements.

The operation of the waveform equalization coefficient generator of FIG. 8 is explained below.

Error data generation unit 10 is the same as the one described in the first embodiment. The difference in error data generation unit 10 of the present embodiment and error data generation unit 10 of the first embodiment is that, in the former unit, the stop data signal 30 is also applied to multiplier 24A.

The operation of complex arithmetic unit 20 is illustrated. The operation of data branch unit 21, the operation of data selection means 22, and the operation of reciprocal data generation unit 23 are the same as in the first embodiment. The output data from second data selection unit 22b, the output data from third data selection unit 22c, and the output data from reciprocal data generation unit 23 are supplied to multiplier 24A.

When coordinate decision unit 11 of error data generation unit 10 produces the stop data signal 30, multiplier 24A judges that the error data, output from third data selection unit 22c, is 0 and provides a 0 as data without carrying out any multiplying operations. On the other hand, in the absence of the stop data signal 30 from coordinate decision unit 11, multiplier 24A multiplies together the aforesaid input data and outputs the result. The operations of other elements of sum-of-products means 24 are the same as in the first embodiment.

As described above, in accordance with the present waveform equalization coefficient generator, multiplier 24A provides a 0 without performing any multiplying operations when third data selection unit 22c outputs error data of 0. This achieves a considerable reduction in the consumption of electric power used in the entire generator. In the STOP&GO algorithm, the possibility that the flag $f_r$ or the flag $f_i$ becomes zero is ½, so that the possibility that coordinate decision unit 11 provides the stop data signal 30 is also ½. As a result, power consumption is cut in half.

The waveform equalization coefficient generator of the first and second embodiments of the present invention may be provided for every digital filter tap or may be provided for common use between taps.

In the first and second embodiments, the error data generation unit 10 is used together with the complex arithmetic unit 20. However, the error data generation unit 10 may be used with a complex arithmetic unit with a different structure which carries out an updating of an equalization coefficient by the separate updating of the real part data and the imaginary part data.

The same effects as described above may be obtained in the case where signals, which are equalized and AFC/APCed and then fed again to the digital equalizer, are used instead of using the input signals $X_r$ and $X_i$.

First Modification

Figure 9:
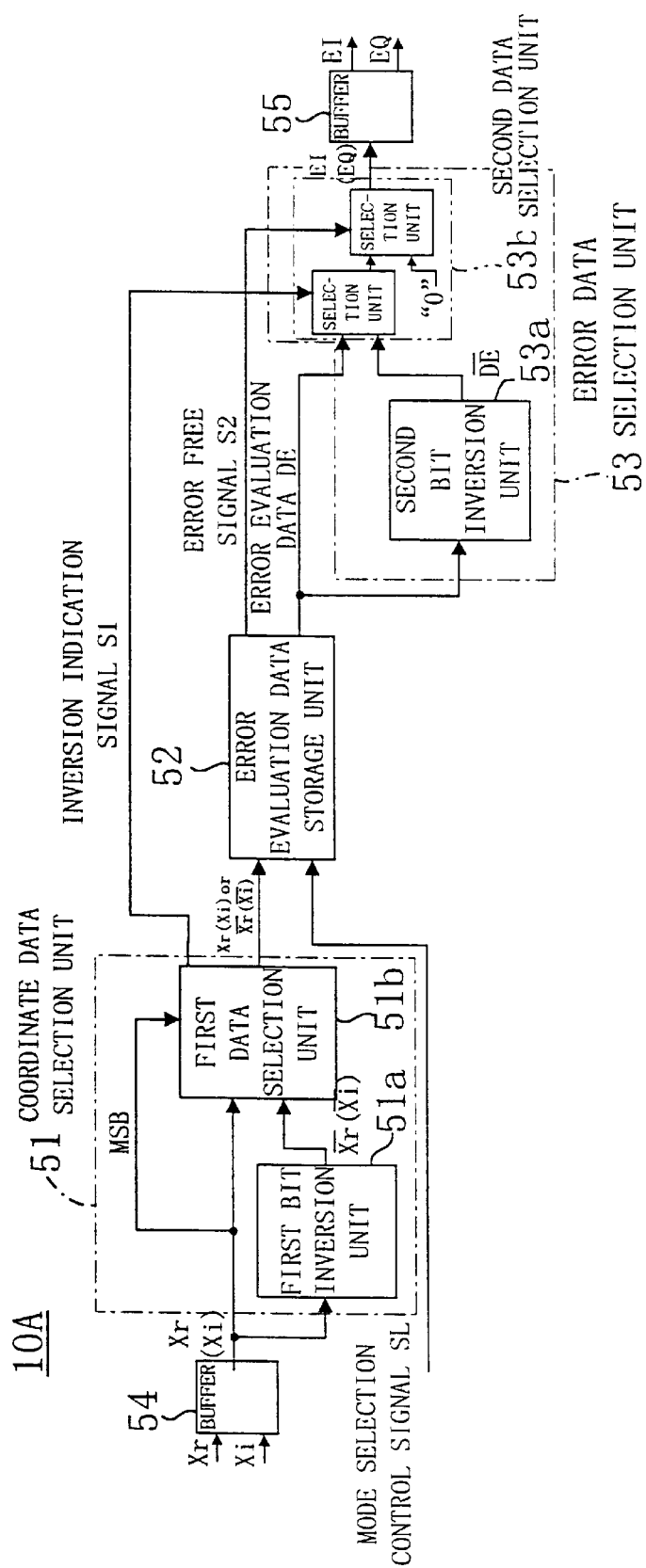
FIG. 9 is a block diagram of an error data generation unit in accordance with a first modification of the present invention.
Figure 10:
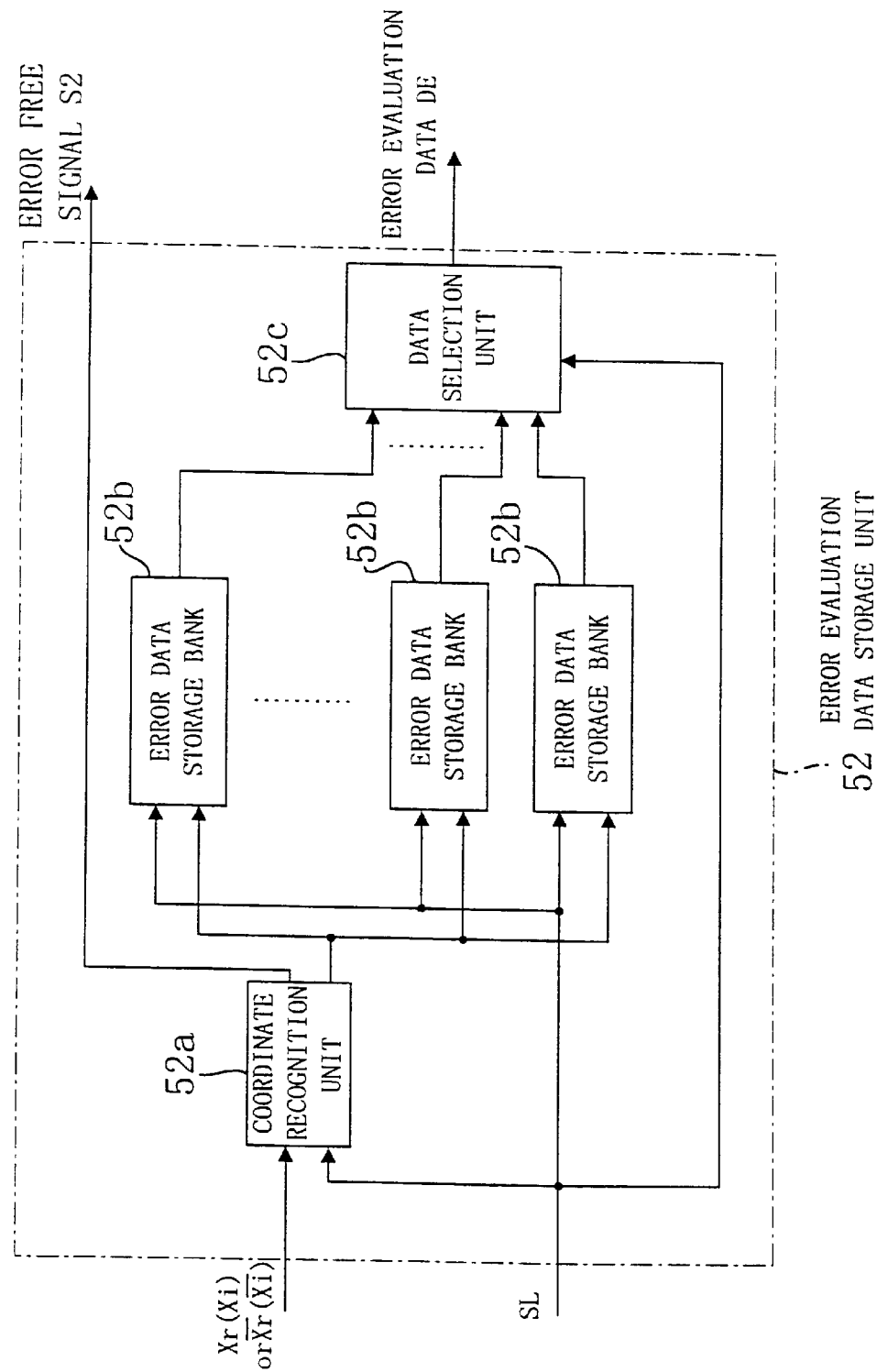
FIG. 10 is a block diagram of an error evaluation data storage unit of the error data generation unit of FIG. 9.

FIG. 9 shows a modification of the error data generation unit 10 of the first and second embodiments of the present invention. As shown in FIG. 9, an error data generation unit 10A of the present modification includes a coordinate data selection unit 51 made up of a first bit inversion unit 51a and a first data selection unit 51b, an error evaluation data storage unit 52, and an error data selection unit 53 made up of a second bit inversion unit 53a and a second data selection unit 53b. In addition to these elements, error data generation unit 10A further includes a buffer 54 and a buffer 55. Buffer 54 temporarily holds the input signal's real part data (the coordinate data's real axis component) $X_r$ and the input signal's imaginary part data (the coordinate data's imaginary axis component) $X_i$ and provides them in sequence. Buffer 55 temporarily holds the error data EI and the error data EQ found. FIG. 10 shows in block form an internal structure of the error evaluation data storage unit 52.

Figure 11:
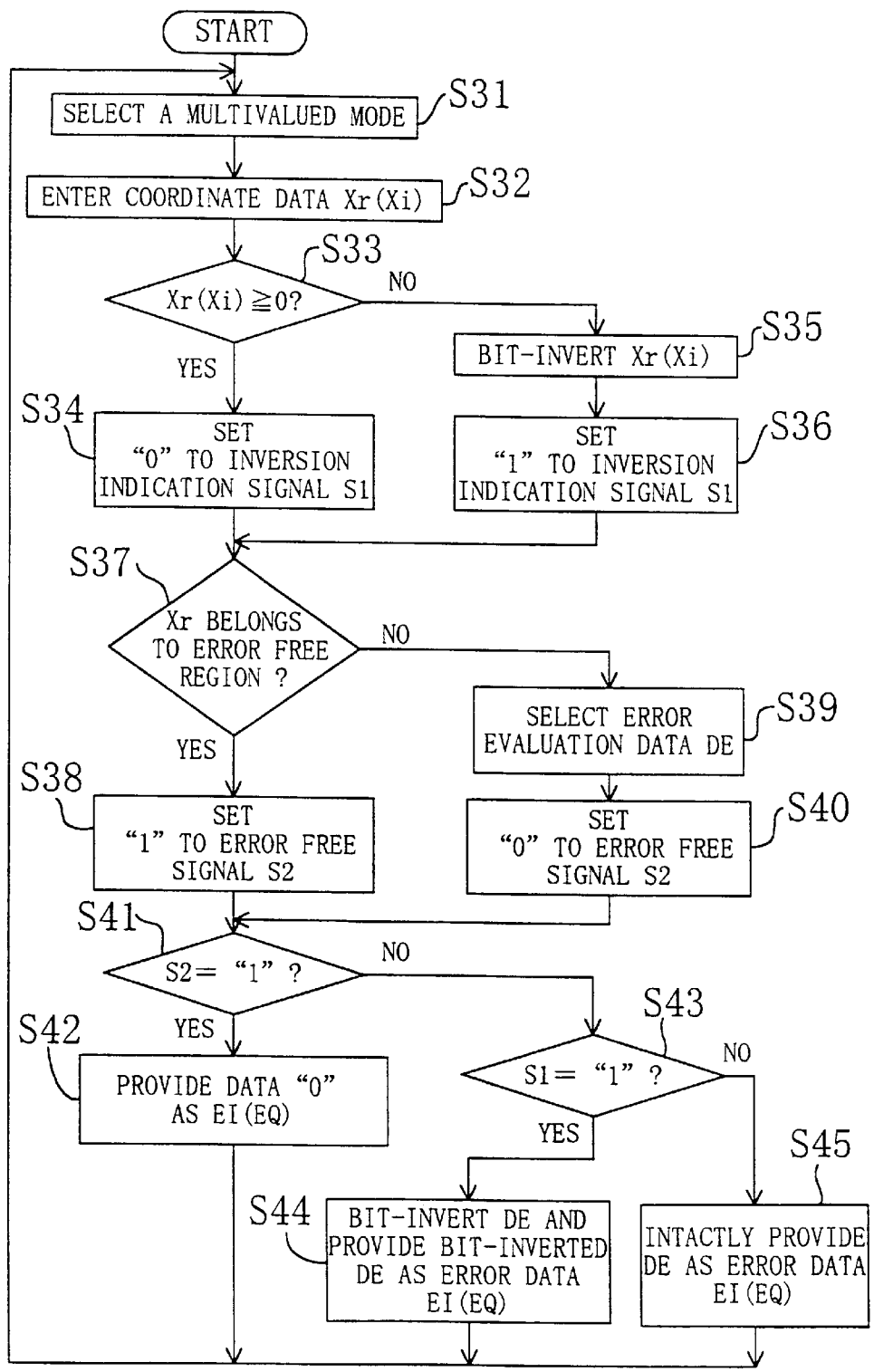
FIG. 11 is a flowchart useful in understanding the operation of the error data generation unit of FIG. 9.

As in the first embodiment, equalization coefficient updating processing is carried out according to Expressions (8) and (9) and the operation of error data generation unit 10A of FIG. 9 is described by a flowchart shown in FIG. 11. The description is made by an example of finding EI from $X_r$.

In an I–Q coordinate plane of multivalued QAM, coordinate data at each coordinate point and error data found by means of a STOP&GO algorithm with respect to each coordinate point, when represented by binary notation, correspond to each other in bit-inverted value. For example, there is the relationship that, if error data corresponding to the coordinate data "00" is "100", then error data corresponding to the coordinate data "11" is "011". In the present modification, error data processing is carried out by making utilization of such a relationship. The use of the relationship allows the error evaluation data storage unit 52 to store, in all the coordinate points, only specific error evaluation data for coordinate data with a positive sign and without the error free region, for each multivalued mode.

In step S31, a multivalued QAM mode is chosen. Error data generation unit 10A shown in FIG. 9 is formed to be compatible with any of 16QAM, 32QAM, 64QAM, and 256QAM. A mode selection signal SL, which is applied from the outside, determines which modulation form of 16QAM, 32QAM, 64QAM and 256QAM to be selected. The mode selection signal SL is entered into error evaluation data storage unit 52. As shown in FIG. 10, error evaluation data storage unit 52 is provided with a plurality of error data storage banks 52b for storing error evaluation data corresponding to respective multivalued modes. An error data storage bank 52b that is referred to when reading error evaluation data, is selected according to the mode selection signal SL. In all the coordinate points, each error data storage bank 52b stores only specific error evaluation data for coordinate data with a positive sign and without the error free region, for each corresponding multivalued mode.

Figure 12:
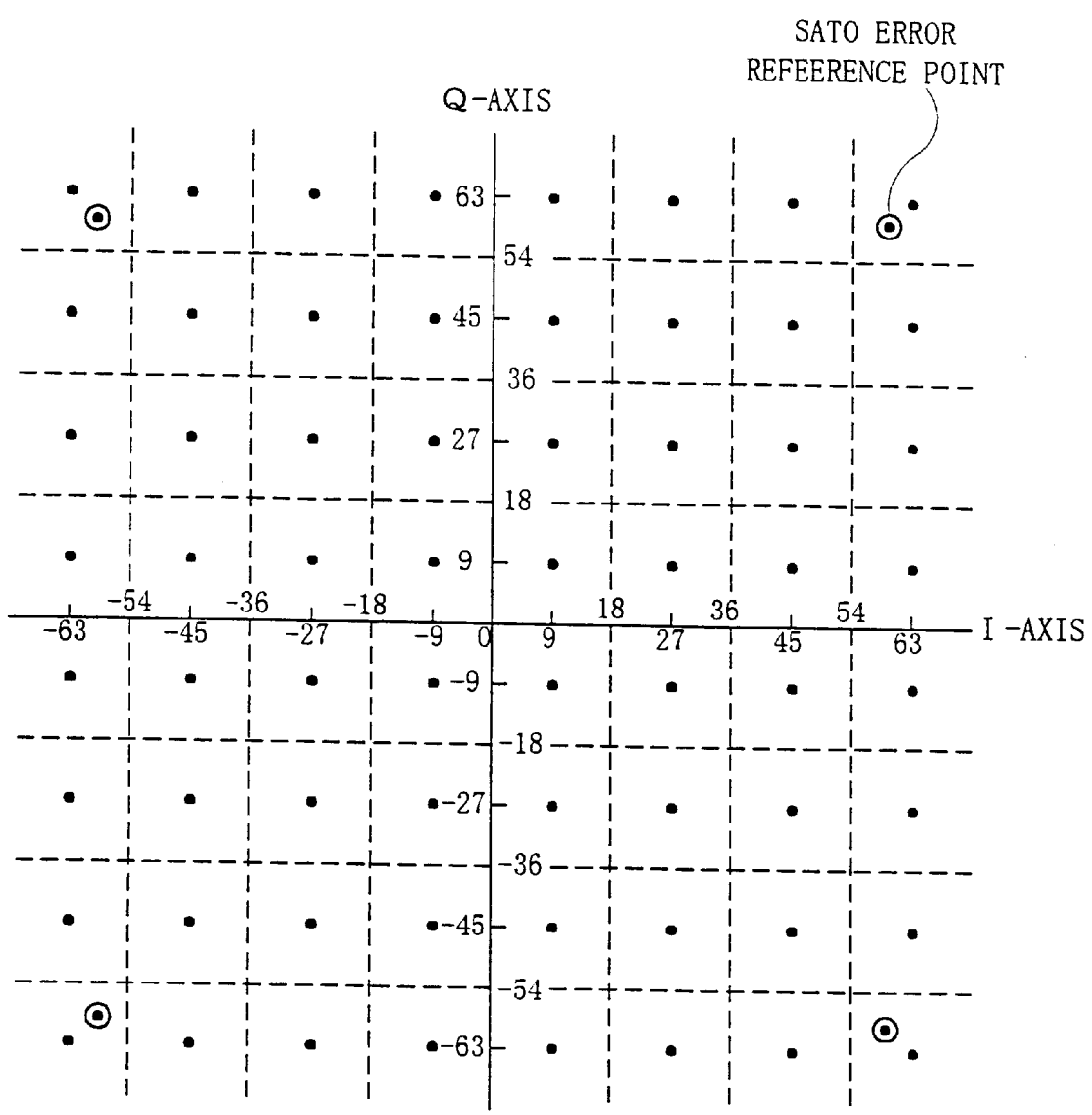
FIG. 12 is a phase diagram showing signal point locations, slice levels and reference points for Sato errors in 64QAM.

The coordinate data $X_r$ is entered into coordinate data selection unit 51 (step S32) and is bit-inverted by first bit inversion unit 51a. Using the MSB (most significant bit) of the coordinate data $X_r$, which is a sign bit, as a selection control signal, first data selection unit 51b selects between $X_r$ and $/X_r$ which is the inverted coordinate data output from first bit inversion unit 51a and provides either $X_r$ or $/X_r$, whichever is selected (steps S33 and S35). At the same time, first data selection unit 51b provides an inversion indication signal S1 indicative of whether $X_r$ is inverted or not. For example, when the selection control signal is "0" (that is, when the coordinate data $X_r$ is positive), the coordinate signal $X_r$ is selected and provided, while a "0" is provided serving as the inversion indication signal S1. On the other hand, when the selection control signal is "1" (when the coordinate data $X_r$ is negative), the inverted coordinate signal $/X_r$ is selected and provided, while a "1" is provided serving as the inversion indication signal S1. When paying attention to processing in the I-axis direction in the FIG. 12 I–Q coordinate plane, the operations up to here are equivalent to the judgement of whether the coordinate data is positive or negative. In FIG. 12, the mark ◎ is equivalent to a Sato error reference point. The mark ● is equivalent to a signal the position of which is indicated by error decision reference data. A broken line is equivalent to a slice level indicated by coordinate decision reference data. Steps S32–36 are carried out by these operations.

Figure 13:
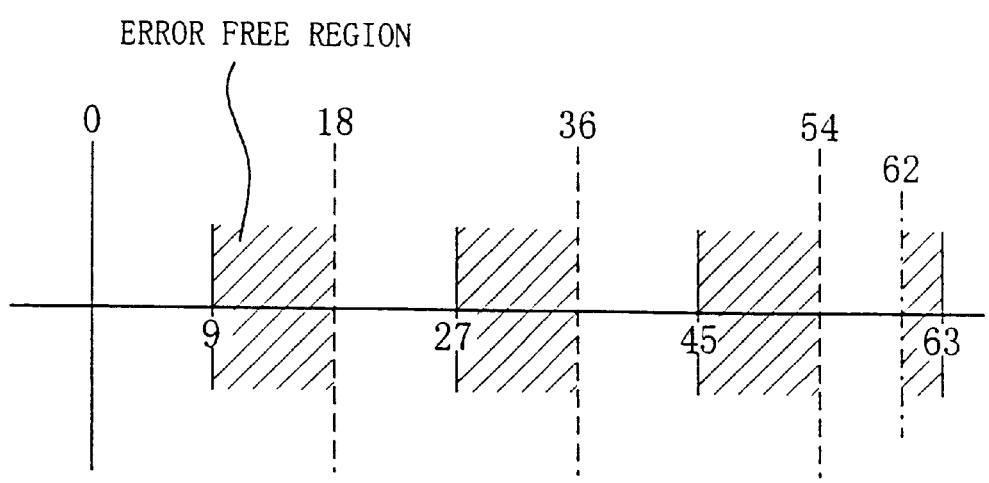
FIG. 13 is a diagram showing error free regions.

Error evaluation data storage unit 52 receives from coordinate data selection unit 51 either $X_r$ (the coordinate data) or $/X_r$ (the inverted coordinate data). Making reference to an error data storage bank 52b selected according to the mode selection signal SL, error evaluation data storage unit 52 then provides error evaluation data DE corresponding either to $X_r$ or to $/X_r$, when supposing an I–Q coordinate plane corresponding to the selected multivalued mode. However, when $X_r$ or $/X_r$ belongs to a hatched error free region of FIG. 13 (S37), the error evaluation data is "0", and coordinate recognition unit 52a therefore provides a "1" as an error free signal S2 when $X_r$ or $/X_r$ belongs to the error free region (S38). At this point in time, data selection unit 52c holds error evaluation data DE which was output for $X_r$ or to $/X_r$ in the preceding state. On the other hand, when neither $X_r$ nor $/X_r$ belongs to the error free region, coordinate recognition unit 52a provides a "0" as the error free signal S2 (S40), and data selection unit 52c provides error evaluation data DE corresponding to $X_r$ or to $/X_r$ (S39). Steps S37–40 are performed by these operations.

The error evaluation data DE is entered into error data selection unit 53 and is bit-inverted by second bit inversion unit 53a. Second data selection unit 53b, which uses the inversion indication signal S1 output from coordinate data selection unit 51 and the error free signal S2 output from error evaluation data storage unit 52 as a selection control signal, selects either DE, /DE which is output from second bit inversion unit 53a or data "0" and provides the selected data (steps S41–45). The data, selectively output from second data selection unit 53b, is provided from error data selection unit 53 as the error data EI.

When the error free signal S2 is "1" (that is, when $X_r$ or $/X_r$ is within the error free region), data "0" is provided as the error data EI (step S42). On the other hand, when the error free data is "0" (that is, when $X_r$ or $/X_r$ is outside the error free region), the error evaluation data DE is provided intact as the error data EI when S1=0 (step S45) or the inverted error evaluation data /DE is provided as the error data EQ when S2 "1" (step S44).

When paying attention to processing in the I-axis direction in the FIG. 2 I–Q coordinate plane, the operations of error data selection unit 53 in steps S41–S45 are equivalent to the processing of providing, in intact manner, DE, as EI, with respect to positive coordinate data previously stored in error evaluation data storage unit 52 because the sign of coordinate data on the coordinate plane is positive when S1="0", and to the processing of providing /DE (the value of a bit-inversion of DE), as EI, with respect to positive coordinate data previously stored in error evaluation data storage unit 52 because the sign of coordinate data on the coordinate plane is negative when S1=1.

With the same operations, the error data EQ can be obtained from the coordinate data $X_i$.

In accordance with the present modification, a considerable reduction of the capacity of storage required by the error data generation unit can be realized because it is sufficient to store only absolute values of corresponding error evaluation data to coordinate data existing outside the error free region, which makes it possible to implement a waveform equalization coefficient generator with downsized circuitry.

Second Modification

Figure 14:
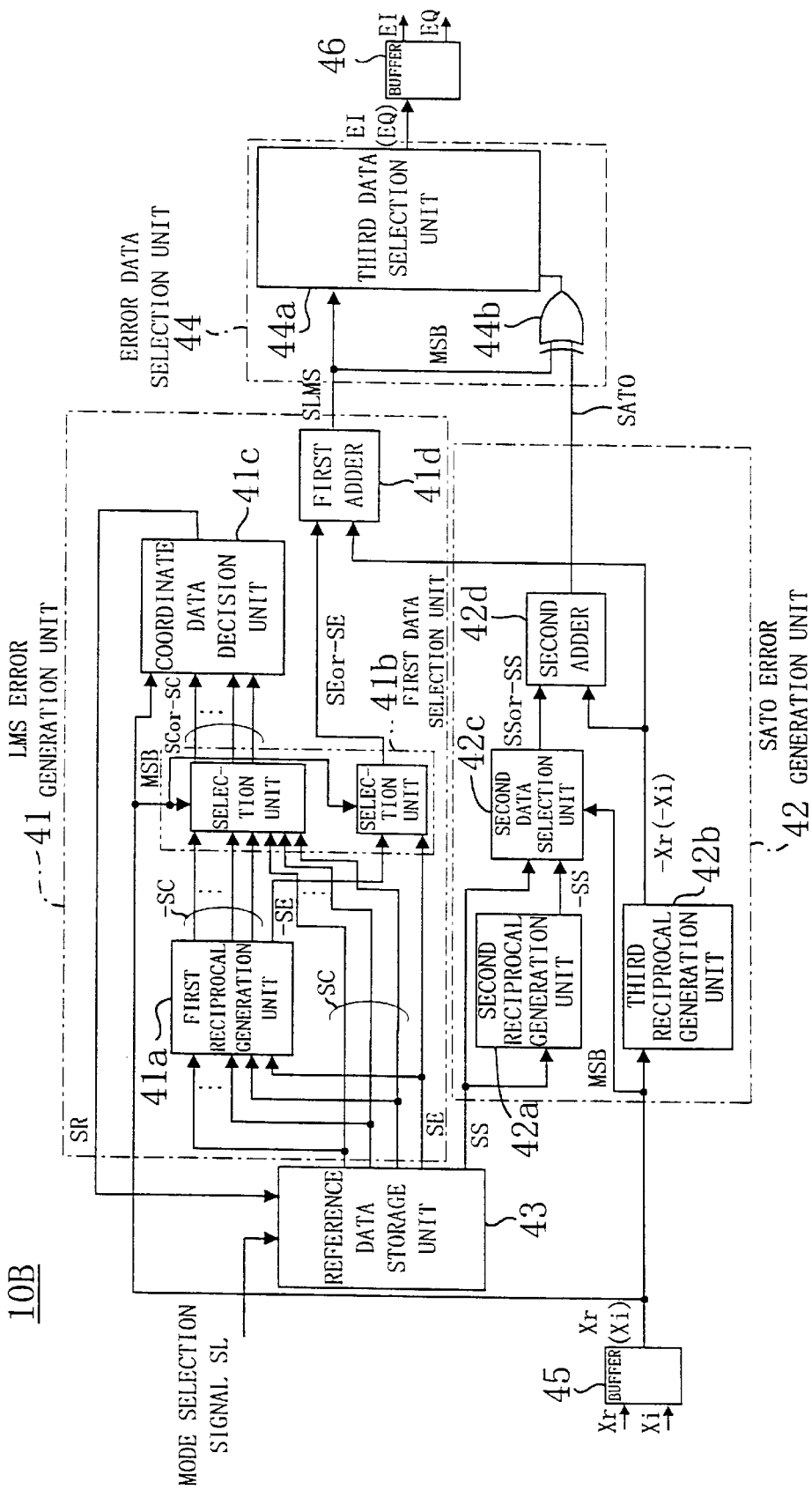
FIG. 14 is a block diagram of an error data generation unit in accordance with a second modification of the present invention.

FIG. 14 is a block diagram of a second modification of error data generation unit 10 in the waveform equalization coefficient generator of the first and second embodiments of the present invention. As shown in FIG. 14, an error data generation unit 10B of the present modification includes an LMS error generation unit 41, a Sato error generation unit 42, a reference data storage unit 43, and an error data selection unit 44. In addition to these elements, error data generation unit 10B further includes a buffer 45 and a buffer 46. Buffer 45 temporarily holds the input signal's real part data (the coordinate data's real axis component) $X_r$ and the input signal's imaginary part data (the coordinate data's imaginary axis component) $X_i$ and provides them in sequence. Buffer 46 temporarily holds the error data EI and the error data EQ found.

LMS error generation unit 41 generates LMS error data SLMS from $X_r$ and $X_i$ which are coordinate data for equalization signal. LMS error data generation unit 41 is composed of a first reciprocal generation unit 41a, a first data selection unit 41b, a coordinate data decision unit 41c, and a first adder 41d. Sato error generation unit 42 generates Sato error data from $X_r$ and $X_i$ and provides the MSB (most significant bit) of the generated Sato error data, which is a sign bit, as a Sato error sign signal SATO. Sato error generation unit 42 has a second reciprocal generation unit 42a, a third reciprocal generation unit 42b, a second data selection unit 42c, and a second adder 42d. Reference data storage unit 43 provides Sato error reference data SS which is referred to when generating Sato error data, error decision reference data SE which is referred to when generating LMS error data SLMS, and coordinate decision reference data SC which is referred to when determining the positions of $X_r$ and $X_i$ in the I–Q coordinate plane, in corresponding form to a multivalued mode of QAM selected by the mode selection signal SL. Error data selection unit 44 uses the LMS error data SLMS output from LMS error generation unit 41 and the Sato error sign signal SATO output from Sato error generation unit 42 for error judgement, to provide the error data EI and EQ. Error data selection unit 44 has a third data selection unit 44a and an exclusive OR (XOR) circuit 44b.

Figure 15:
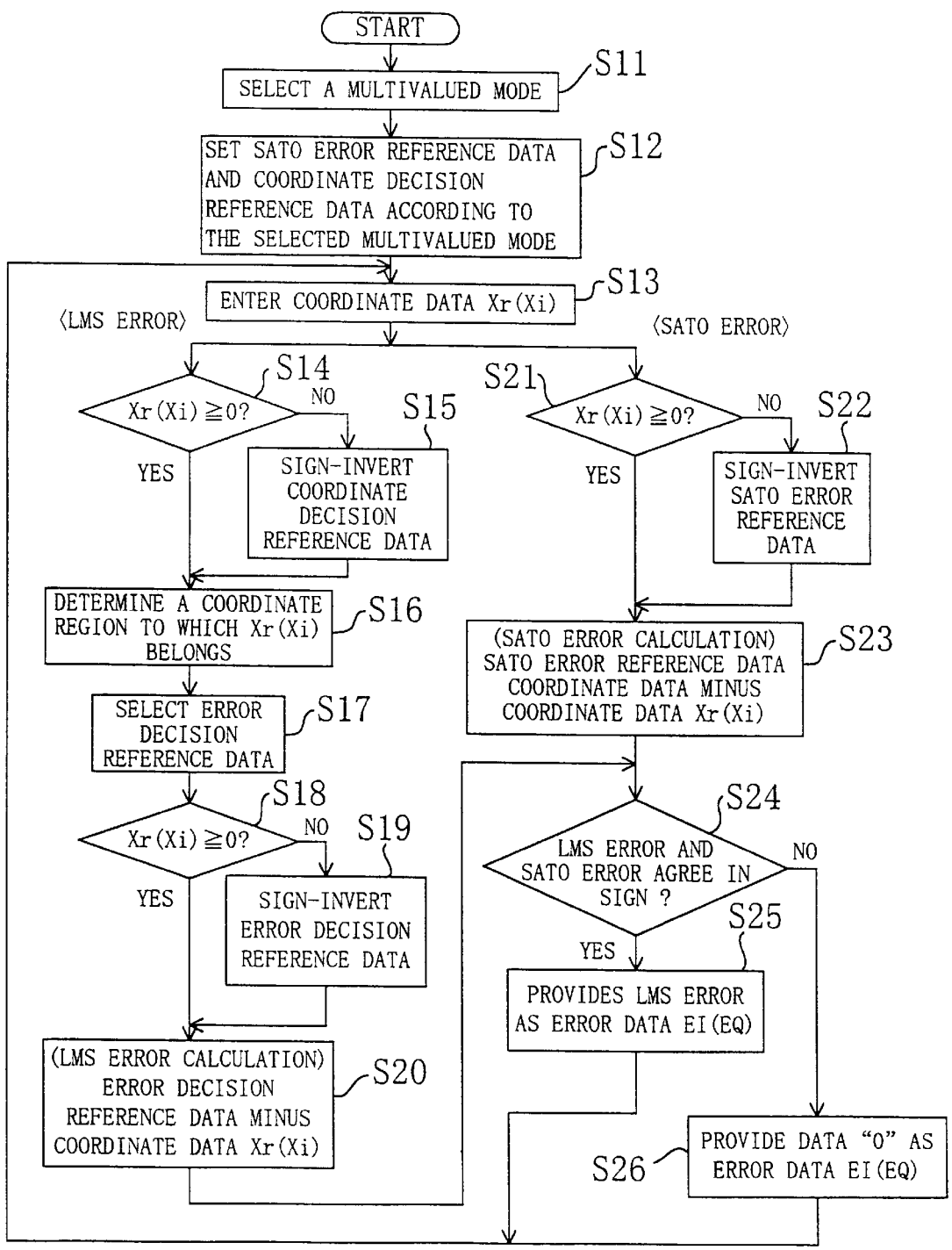
FIG. 15 is a flowchart useful in understanding the operation of the error data generation unit of FIG. 14.
Figure 16:
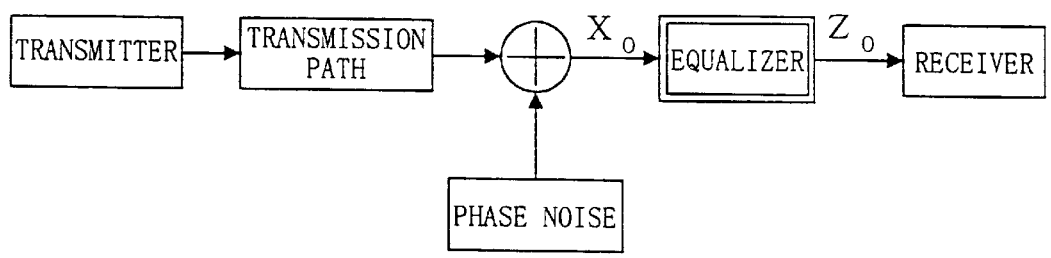
FIG. 16 is a diagram showing a transmission path and an equalization model thereof.
Figure 17:
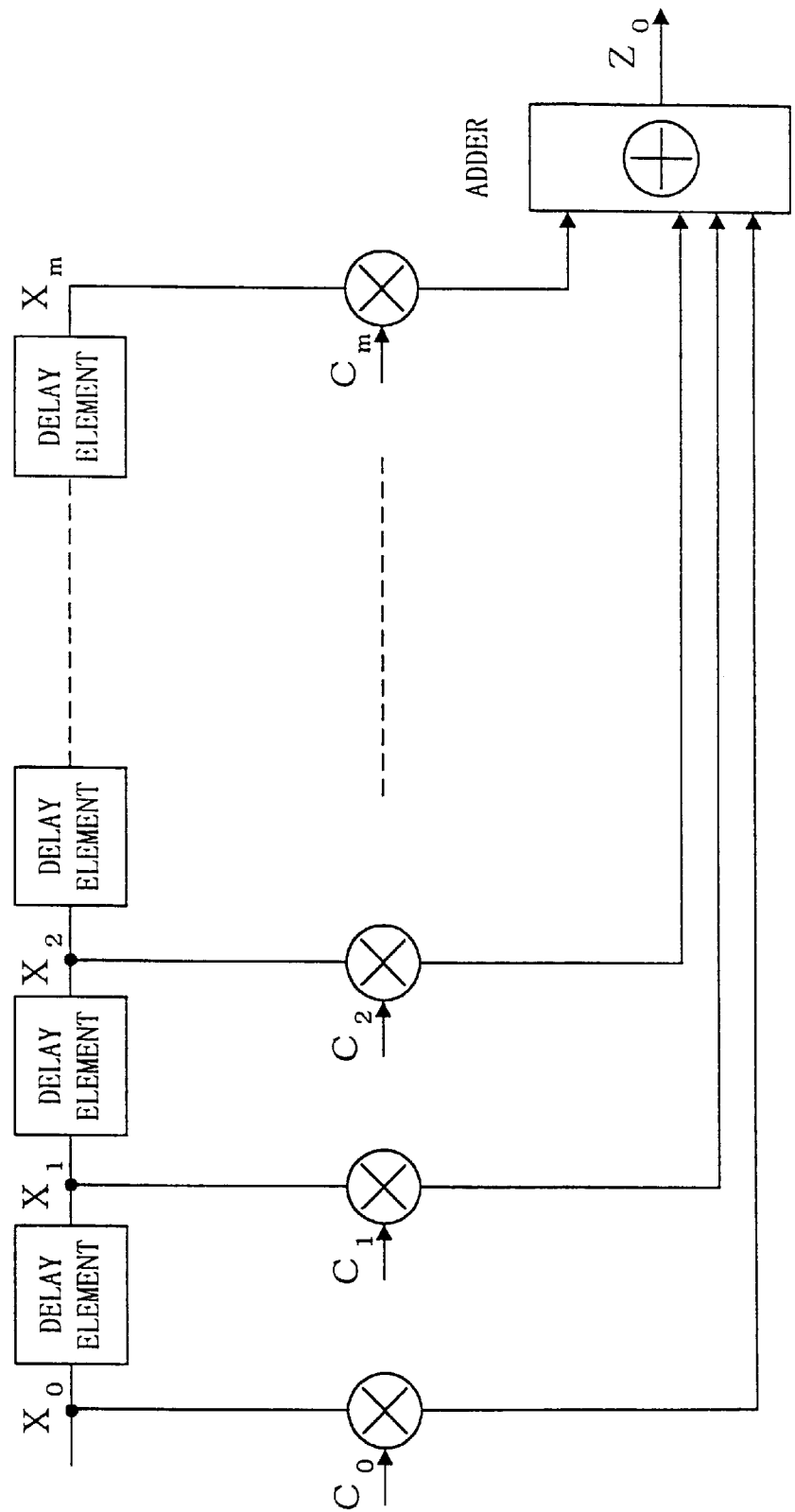
FIG. 17 shows an example of digital filters.

Suppose that equalization coefficient updating is carried out according to Expressions (8) and (9) as in the first embodiment, and the operation of the error data generation unit 10B of FIG. 14 is described by making reference to a flowchart shown in FIG. 15. Here, a case as an example is explained in which the error data EI is found from $X_r$ (the coordinate data's real axis component).

In step S11, a multivalued mode of QAM is chosen. Error data generation unit 10B shown in FIG. 14 is formed to be compatible with any form of 16QAM, 32QAM, 64QAM, and 256QAM. The mode selection signal SL is the signal which is applied from the outside and which determines which modulation form of 16QAM, 32QAM, 64QAM and 256QAM to be selected. The mode selection signal SL is entered into reference data storage unit 43.

In step S12, the Sato error reference data SS and the coordinate decision reference data SC are set according to the multivalued mode selected in step S11. Reference data storage unit 43 stores data corresponding to respective multivalued modes shown in the following table. Reference data storage unit 43 selects and provides the data SS and SC according to a QAM multivalued mode indicated by the mode selection signal SL. For example, when 64QAM is indicated, data of three different types, shown in the table, are provided from reference data storage unit 43, as the coordinate decision reference data SC.

TABLE

|  | 16 QAM | 32 QAM | 64 QAM | 256 QAM |
| --- | --- | --- | --- | --- |
| SATO ERROR REF DATA 1 | 73 | 61 | 62 | 56 |
| COORDINATE DECISION REF. DATA 1 | 44 | 52 | 54 | 56 |
| COORDINATE DECISION REF. DATA 2 |  | 26 | 36 | 48 |
| COORDINATE DECISION REF. DATA 3 |  |  | 18 | 40 |
| COORDINATE DECISION REF. DATA 4 |  |  |  | 32 |
| COORDINATE DECISION REF. DATA 5 |  |  |  | 24 |
| COORDINATE DECISION REF. DATA 6 |  |  |  | 16 |
| COORDINATE DECISION REF. DATA 7 |  |  |  | 8 |
| ERROR DECISION REF. DATA 1 | 66 | 65 | 63 | 60 |
| ERROR DECISION REF. DATA 2 | 22 | 39 | 45 | 52 |

TABLE-continued

| | 16 QAM | 32 QAM | 64 QAM | 256 QAM |
|---|---|---|---|---|
| ERROR DECISION REF. DATA 3 | | | 13 | 27 | 44 |
| ERROR DECISION REF. DATA 4 | | | | 9 | 36 |
| ERROR DECISION REF. DATA 5 | | | | | 28 |
| ERROR DECISION REF. DATA 6 | | | | | 20 |
| ERROR DECISION REF. DATA 7 | | | | | 12 |
| ERROR DECISION REF. DATA 8 | | | | | 4 |

In step S13, the coordinate data $X_r$ is entered. In subsequent steps, LMS and Sato errors are generated with respect to the coordinate data $X_r$.

LMS Error Generation Processing

LMS error generation unit 41 performs an LMS error generation process of the steps S14–20. First reciprocal generation unit 41a converts coordinate decision reference data SC output from reference data storage unit 43 into reciprocal coordinate decision reference data—SC which is identical in absolute value with the data SC and which is the sign-inverted data of the data SC. Thereafter, first data selection unit 41b selects between SC (the coordinate decision reference data output from reference data storage unit 43) and—SC (the reciprocal coordinate decision reference data output from first reciprocal generation unit 41a) wherein the MSB of the coordinate data $X_r$, which is a sign bit, is used as a selection control signal, and provides SC or—SC, whichever is selected. For example, first data selection unit 41b selects and provides the data SC when the selection control signal is "0" (that is, when the data $X_r$ is positive). On the other hand, first data selection unit 41b selects and provides the data—SC when the selection control signal is "1" (that is, when the data $X_r$ is negative). Steps 14 and 15 are carried out by these operations.

Coordinate data decision unit 41c receives the data SC or the data—SC output form first data selection unit 41b and the data $X_r$, determines which of coordinate ranges, defined by the data SC and—SC on the FIG. 12 I–Q coordinate plane, the received data belongs to, and provides a coordinate data decision signal SR.

In FIG. 12, the mark ⊚ corresponds to a Sato error reference point. The mark ● corresponds to a signal point the location of which is represented by error decision reference data. A broken line corresponds to a slice level indicated by coordinate decision reference data. The processing of determining which of ranges surrounded by broken lines an equalization signal coordinate belongs to (step S16) is carried out by making a comparison between coordinate decision reference data equivalent to a respective slice level and equalization signal coordinate data.

The coordinate data decision signal SR output from coordinate data decision unit 41c is entered into reference data storage unit 43. According to the coordinate data decision signal SR and the mode selection signal SL, reference data storage unit 43 selects, from the data stored therein, corresponding error decision reference data SE to a coordinate range indicated by the coordinate data decision signal SR, and provides the selected data. Step 17 is performed by these operations.

First reciprocal generation unit 41a converts error decision reference data SE output from reference data storage unit 43 into reciprocal error decision reference data—SE which is identical in absolute value with the data SE and which is the sign-inverted data of the data SE. First data selection unit 41b selects between the data SE output from reference data storage unit 43 and the data—SE output from first reciprocal generation unit 41a wherein the MSB of the coordinate data $X_r$, which is a sign bit, is used as a selection control signal, and provides the selected data. For example, first data selection unit 41b selects and provides the data—SE when the selection control signal is "0" (that is, when the coordinate data $X_r$ is positive). On the other hand, first data selection unit 41b selects and provides the data—SE when the selection control signal is "1" (that is, when the coordinate data $X_r$ is negative). Steps 18 and 19 are carried out by these operations.

First adder 41d adds together the error decision reference data SE (or the reciprocal error decision reference data—SE) output from first data selection unit 41b and the reciprocal coordinate data /$X_r$ output from Sato error generation unit 42 which has the same absolute value as the coordinate data $X_r$ and a sign-inverted relationship with the coordinate data $X_r$, thereby producing sum. The produced sum is provided as the LMS error data SLMS. Step S20 is carried out by these operations.

Sato Error Generation Processing

Sato error generation processing of steps S21–S23 is carried out in Sato error generation unit 42. Second reciprocal generation unit 42a converts the data SS output from reference data storage unit 43 into the data—SS having the same absolute value as the data SS and a sign-inverted relationship with the data SS. Subsequently, second data selection unit 42c uses, as a selection control signal, the MSB of the coordinate data $X_r$ which is a sign bit, to select between the data SS and the data—SS. For example, when the selection control signal is "0" (that is, when the coordinate data $X_r$ is positive), the data SS is selected and provided.

On the other hand, when the selection control signal is "1" (when the coordinate data $X_r$ is negative), the data—SS is selected and provided. Steps S21 and S22 are carried out by these operations.

Third reciprocal generation unit 42b generates the reciprocal coordinate data—$X_r$ having the same absolute value as the coordinate data $X_r$ and having a sign-inverted relationship with the coordinate data $X_r$. Second adder 42d forms the sum of the Sato error reference data SS (or the reciprocal Sato error reference data—SS) output from second data selection unit 42c and the reciprocal coordinate data—$X_r$ output from third reciprocal generation unit 42d, to find Sato error data (step S23). The MSB of the found Sato error data, which is a sign bit, is provided from second adder 42d as the Sato error sign signal SATO.

Error Data Selection Processing

Error data selection processing of steps S24–S26 is carried out in error data selection unit 44.

The MSB of the LMS error data SLMS output from LMS error generation unit 41 is XORed with the Sato error sign signal SATO by XOR circuit 44b, and the obtained XOR signal is applied, as a selection control signal, from XOR circuit 44b to third data selection unit 44a. Based on the selection control signal output from XOR circuit 44b, third data selection unit 44a selects between the LMS error data SLMS and the constant data "0" and provides the selected data as the error data EI. When the selection control signal is "0" (that is, when the LMS error data and the Sato error data have the same sign), the LMS error data SLMS is provided as the error data EI. On the other hand, when the selection control signal is "1" (when the LMS error data and the Sato error data have different signs), the constant data "0" is provided as the error data EI. In the above-described way, steps S24–S26 are carried out.

The same operations may be applied to finding EQ (the error data) from $X_i$ (the coordinate data).

As described above, in accordance with the present modification, it is possible to calculate error data from all coordinate data by storing only absolute values of corresponding coordinate decision reference data, error decision reference data, and Sato error reference data to respective multivalued modes. A considerable reduction in the capacity of storage required by the error data generation unit can be realized, which makes it possible to implement a waveform equalization coefficient generator with downsized circuitry.

In addition to using the error data generation units 10A and 10B of the first and second modifications instead of using the error data generation unit 10 of the first and second embodiments, they may be used together with a complex arithmetic unit which updates an equalization coefficient by means of the separate updating of real part data and imaginary part data of the equalization coefficient with different arithmetic units.

The invention claimed is:

1. A waveform equalization coefficient generator utilized in a digital equalizer for waveform equalizing a multivalued quadrature amplitude modulation (QAM) modulated signal, said waveform equalization coefficient generator operative for generating equalization coefficients for respective taps of digital filters which perform signal waveform equalization, said waveform equalization coefficient generator comprising:

an error data generation unit for generating error data necessary to update an equalization coefficient to a received signal; and a complex arithmetic unit for performing, based on said received signal and error data output from said error data generation unit, updating of said equalization coefficient by means of separate updating of real part data and imaginary part data of said equalization coefficient, said error data generation unit and said complex arithmetic unit being provided for common use between taps.

* * * * *

UNITED STATES PATENT AND TRADEMARK OFFICE
CERTIFICATE OF CORRECTION

PATENT NO. : 6,434,193 B1
DATED : August 13, 2002
INVENTOR(S) : Toshihiko Fukuoka It is certified that error appears in the above-identified patent and that said Letters Patent is hereby corrected as shown below:

<u>Title page,</u>
Item [30], Foreign Application Priority Data, change "Apr. 16, 1998" to
-- Apr. 16, 1996 --

Item [56], References Cited, change "5,710,792" to -- 5,710,793 --

Signed and Sealed this

Twenty-fifth Day of February, 2003

JAMES E. ROGAN
*Director of the United States Patent and Trademark Office*